US012809266B2

(12) United States Patent
Fujimoto et al.

(10) Patent No.: US 12,809,266 B2
(45) Date of Patent: Nov. 24, 2026

(54) SUBSTRATE TREATMENT METHOD, AND COMPUTER STORAGE MEDIUM

(71) Applicant: Tokyo Electron Limited, Tokyo (JP)

(72) Inventors: Seiji Fujimoto, Koshi City (JP); Satoru Shimura, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 672 days.

(21) Appl. No.: 18/354,889

(22) Filed: Jul. 19, 2023

(65) Prior Publication Data

US 2024/0036473 A1 Feb. 1, 2024

(30) Foreign Application Priority Data

Jul. 28, 2022 (JP) ................................. 2022-120838

(51) Int. Cl.

| | |
|---|---|
| ***G03F 7/40*** | (2006.01) |
| ***G03F 7/00*** | (2006.01) |
| ***G03F 7/34*** | (2006.01) |
| ***G03F 7/36*** | (2006.01) |
| ***G03F 7/38*** | (2006.01) |

(52) U.S. Cl.

CPC ................ *G03F 7/40* (2013.01); *G03F 7/343* (2013.01); *G03F 7/36* (2013.01); *G03F 7/38* (2013.01); *G03F 7/70875* (2013.01)

(58) Field of Classification Search

CPC ... G03F 7/40; G03F 7/343; G03F 7/36; G03F 7/38; G03F 7/70875; G03F 7/20; G03F 7/26; G03F 7/0042; G03F 7/168; H10P 76/2041

See application file for complete search history.

(56) References Cited

U.S. PATENT DOCUMENTS

| | | | | |
|---|---|---|---|---|
| 2018/0164689 | A1 * | 6/2018 | Sano | G03F 7/38 |
| 2020/0233308 | A1 * | 7/2020 | Kawakami | G03F 7/168 |
| 2022/0299877 | A1 * | 9/2022 | Weidman | G03F 7/168 |
| 2024/0329539 | A1 * | 10/2024 | Tan | G03F 7/36 |

FOREIGN PATENT DOCUMENTS

| | | |
|---|---|---|
| JP | 2020-129607 A | 8/2020 |

* cited by examiner

*Primary Examiner* — Stewart A Fraser

(74) *Attorney, Agent, or Firm* — Posz Law Group, PLC

(57) ABSTRACT

A substrate treatment method for performing a treatment for forming a pattern through precursor formation and a condensation reaction of a metal-containing resist, includes: suppressing the precursor formation of a film of the metal-containing resist formed on a substrate on which exposure and a PEB treatment have been performed; and subsequent thereto, improving selectivity of the film by the condensation reaction in the film before the forming the pattern.

11 Claims, 15 Drawing Sheets

SUBSTRATE TREATMENT METHOD, AND COMPUTER STORAGE MEDIUM

CROSS REFERENCE TO RELATED APPLICATIONS

This application is based upon and claims the benefit of priority of the prior Japanese Patent Application No. 2022-120838, filed in Japan on Jul. 28, 2022, the entire contents of which are incorporated herein by reference.

TECHNICAL FIELD

This disclosure relates to a substrate treatment method, a computer storage medium, and a substrate treatment apparatus.

BACKGROUND

A substrate treatment apparatus disclosed in Japanese Laid-open Patent Publication No. 2020-129607 includes a thermal treatment unit which thermally treats a substrate on which a coating film of a metal-containing resist has been formed and an exposure treatment has been performed on the coating film, and a developing treatment unit which performs a developing treatment on the coating film on which the thermal treatment has been performed. In the substrate treatment apparatus, the thermal treatment unit has a hot plate which supports and heats the substrate, a chamber which covers a treatment space on the hot plate, a gas discharger which discharges gas containing moisture toward and from above the substrate on the hot plate in the chamber, an exhauster which exhausts the inside of the chamber from the outer periphery of the treatment space, and a heater which is provided in the chamber and heats the chamber.

SUMMARY

An aspect of this disclosure is a substrate treatment method for performing a treatment for forming a pattern through precursor formation and a condensation reaction of a metal-containing resist, the substrate treatment method including: suppressing the precursor formation of a film of the metal-containing resist formed on a substrate on which exposure and a PEB treatment have been performed; and subsequent thereto, improving selectivity of the film by the condensation reaction in the film before the forming the pattern.

DETAILED DESCRIPTION

In a manufacturing process of a semiconductor device or the like, a series of treatments are performed to form a resist pattern on a substrate such as a semiconductor wafer (hereinafter, referred to as a "wafer"). The series of treatments include, for example, a resist coating treatment of supplying a resist onto the substrate to form a resist film, an exposure treatment of exposing the resist film, a treatment of heating so as to accelerate the chemical reaction in the resist film after exposure, a developing treatment of developing the exposed resist film to form a resist pattern, and so on.

Conventionally, a chemically amplified resist is often used as the resist, but a metal-containing resist is sometimes used in recent years. However, in the case of using the metal-containing resist, the formation of an excellent resist pattern is sometimes failed.

Hence, the technique according to this disclosure forms an excellent pattern of the metal-containing resist.

Hereinafter, a substrate treatment method and a substrate treatment apparatus according to an embodiment will be explained with reference to the drawings. Note that, in the description and the drawings, components having substantially the same functional configurations are denoted by the same reference signs to omit duplicate explanations.

First Embodiment

<Wafer Treatment Apparatus>

Figure 1:
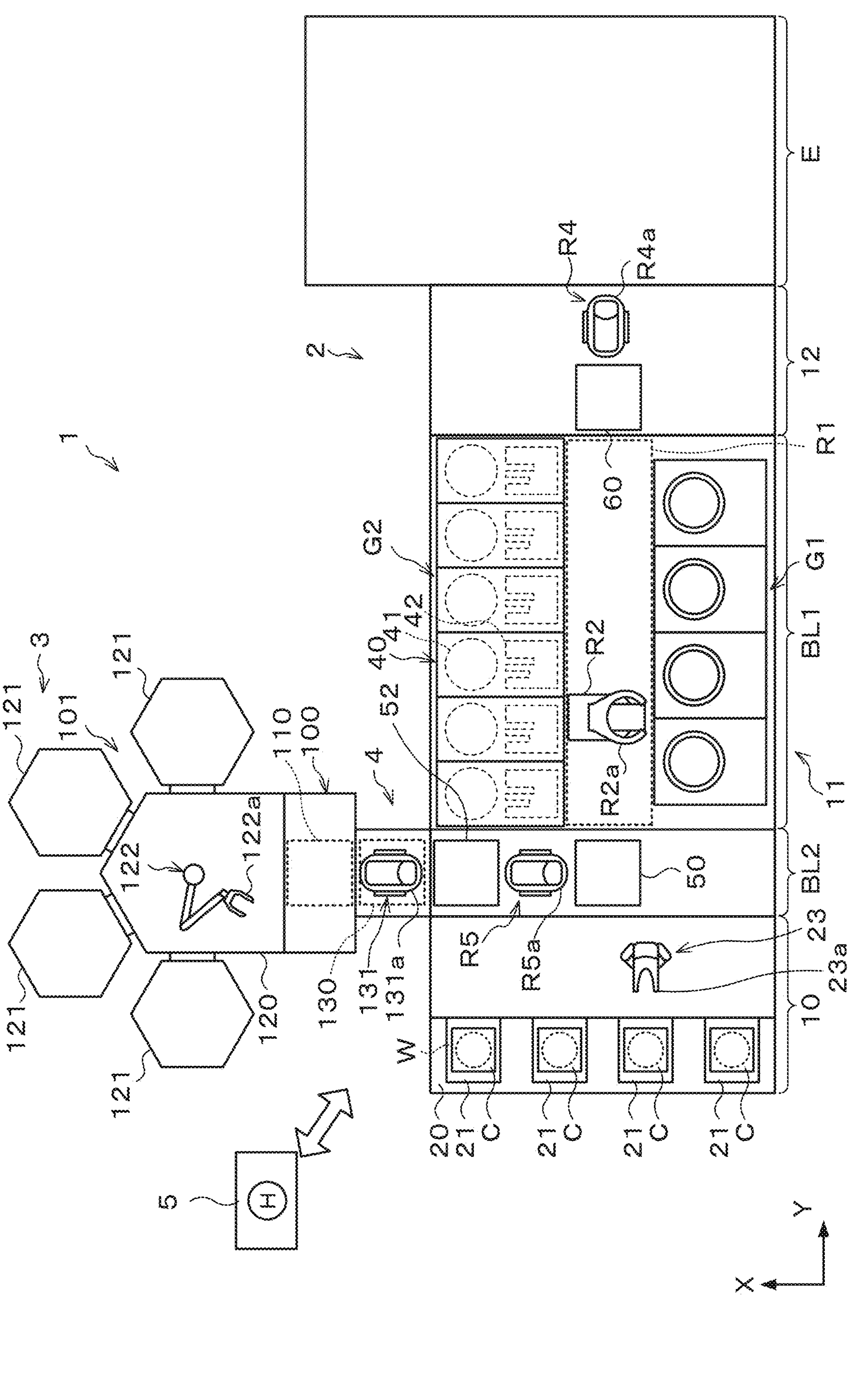
FIG. 1 is an explanatory view illustrating the outline of an internal configuration of a wafer treatment apparatus as a substrate treatment apparatus according to a first embodiment.
Figure 2:
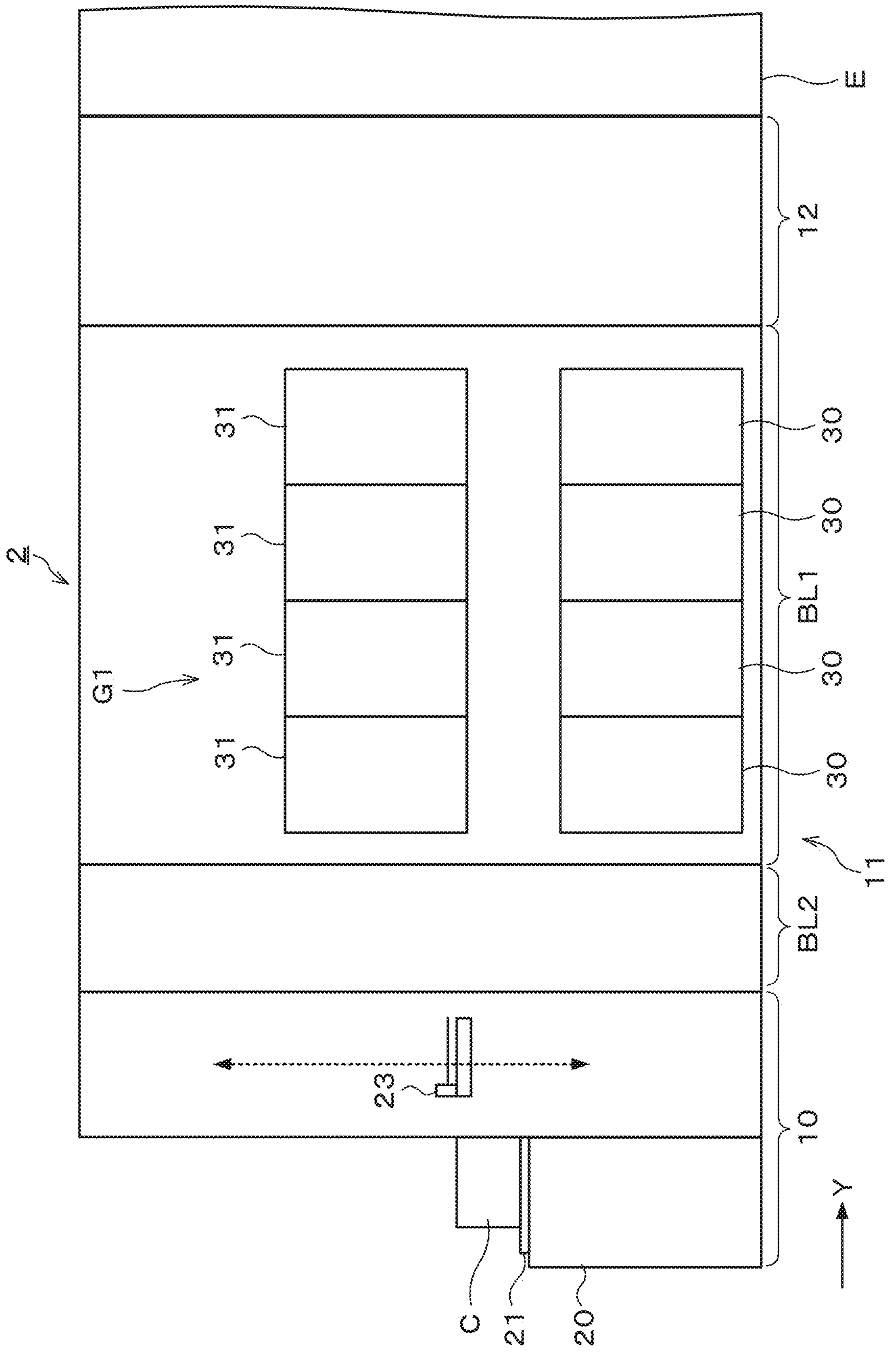
FIG. 2 is a view illustrating the outline of an internal configuration on the front side of a wet treatment part.
Figure 3:
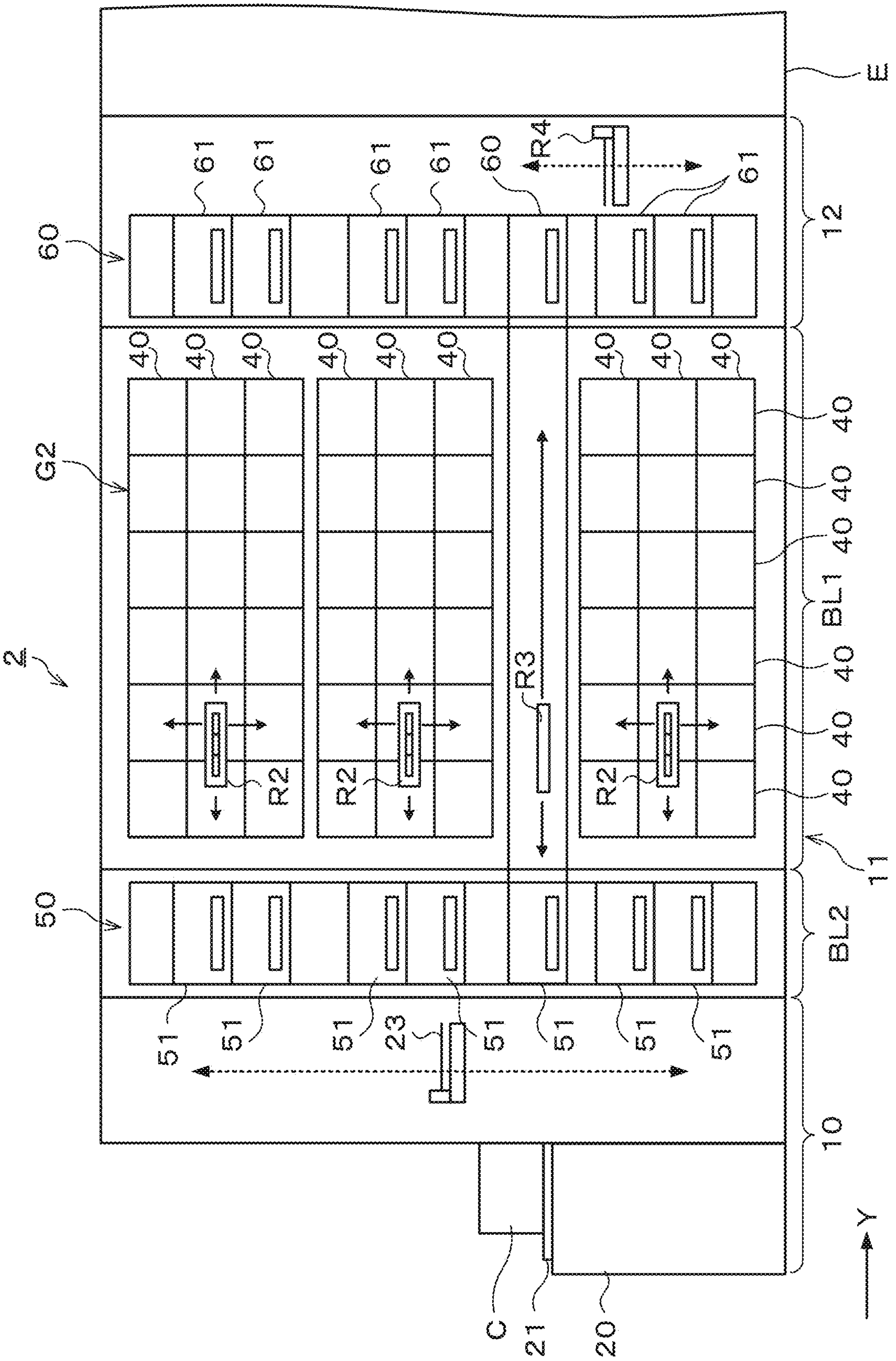
FIG. 3 is a view illustrating the outline of the internal configuration on the rear side of the wet treatment part.
Figure 4:
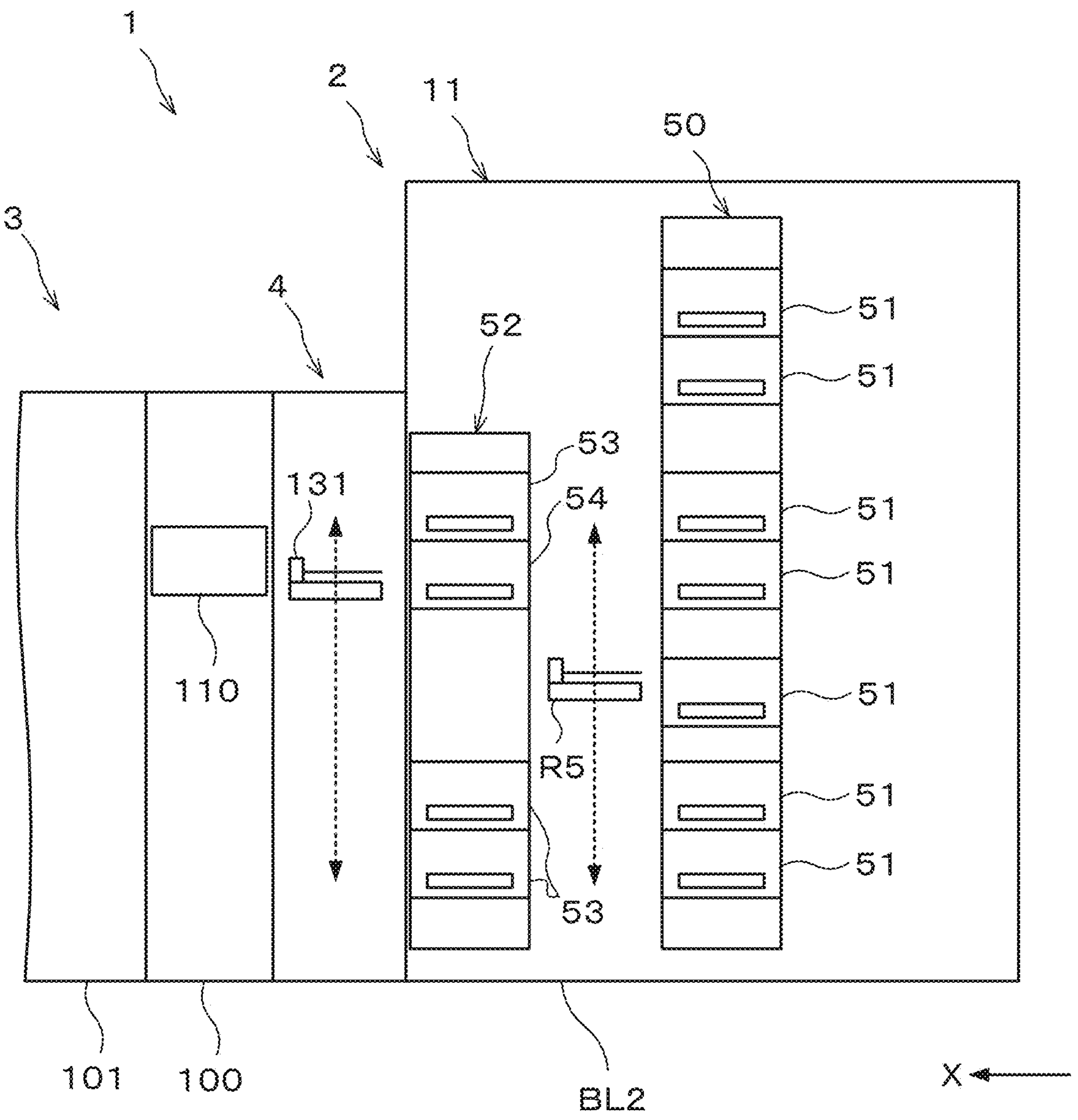
FIG. 4 is a view schematically illustrating a cross section of the wafer treatment apparatus in FIG. 1 at a delivery block portion.

FIG. 1 is an explanatory view illustrating the outline of an internal configuration of a wafer treatment apparatus as a substrate treatment apparatus according to a first embodiment. FIG. 2 and FIG. 3 are views illustrating the outline of an internal configuration on the front side and the rear side of a later-explained wet treatment part, respectively. FIG. 4 is a view schematically illustrating a cross section of the wafer treatment apparatus in FIG. 1 at a later-explained delivery block portion.

The wafer treatment apparatus 1 in FIG. 1 forms a resist pattern on a wafer W as a substrate using a metal-containing resist. Note that the metal contained in the metal-containing resist may be any metal, and is tin in this embodiment.

The wafer treatment apparatus 1 includes, for example, a wet treatment part 2, a dry treatment part 3, and a relay transfer part 4.

The wet treatment part 2 includes, as illustrated in FIG. 1 to FIG. 3, a cassette station 10, a treatment station 11, and an interface station 12, and is coupled to an exposure apparatus E. The exposure apparatus E performs an exposure treatment on the wafer W, specifically, performs the exposure treatment on the wafer W using EUV (Extreme Ultra-Violet) light. In the wet treatment part 2, the cassette station 10, the treatment station 11, and the interface station 12 are integrally connected.

Note that a coupling direction of the wet treatment part 2 and the exposure apparatus E is called a width direction, and a direction perpendicular to the coupling direction, namely, the width direction in top view is called a depth direction in the following.

To/from the cassette station 10 of the wet treatment part 2, a cassette C that is a housing container configured to be able to house a plurality of wafers W is transferred in/out.

In the cassette station 10, a cassette stage 20 is provided, for example, at an end portion on a width direction one side (Y-direction negative side in FIG. 1 and so on). On the cassette stage 20, a plurality of, for example, four stage plates 21 are provided. The stage plates 21 are provided side by side in a row in the depth direction (X-direction in FIG. 1). On the stage plates 21, the cassettes C can be mounted when the cassettes C are transferred in/out from/to the outside of the wet treatment part 2.

Further, in the cassette station 10, a transfer module 23 which transfers the wafer W is provided, for example, at a width direction other side (Y-direction positive side in FIG. 1). The transfer module 23 has a transfer arm 23*a* configured to be movable in the depth direction (X-direction in FIG. 1). Further, the transfer arm 23*a* of the transfer module 23 is configured to be movable also in a vertical direction and a direction around a vertical axis. The transfer module 23 can transfer the wafer W between the cassette C on each of the stage plates 21 and a delivery module 51 in a later-explained delivery tower 50.

Note that in the cassette station 10, a storage section (not illustrated) where the cassette C is mounted and stored may be provided above the cassette stage 20 or at a portion farther away from the exposure apparatus E than the cassette stage 20 (Y-direction negative side portion in FIG. 1).

The treatment station 11 includes a plurality of various treatment apparatuses which perform predetermined treatments such as a resist film formation and so on.

The treatment station 11 is divided into a plurality of (two in the example in the drawing) blocks each including various modules. A treatment block BL1 is provided on the interface station 12 side, and a delivery block BL2 is provided on the cassette station 10 side.

The treatment block BL1 has, for example, a first block G1 on the front side (X-direction negative side in FIG. 1) and has a second block G2 on the deep side (X-direction positive side in FIG. 1).

For example, in the first block G1, as illustrated in FIG. 2, a plurality of solution treatment modules, for example, developing modules 30 as wet developing parts each of which performs a developing treatment on the wafer W in a wet mode and resist coating apparatuses 31 as resist coaters each of which applies a metal-containing resist to the wafer W to form a film of the metal-containing resist, namely, a metal-containing resist film are arranged in this order from the bottom.

For example, the developing module 30 and the resist coating module 31 are arranged four each side by side in the width direction (Y-direction in FIG. 1). Note that the numbers and the arrangements of the developing modules 30 and the resist coating modules 31 can be arbitrarily selected.

In each of the developing module 30 and the resist coating module 31, a predetermined treatment solution is applied onto the wafer W, for example, by the spin coating method. In the spin coating, the treatment solution is discharged onto the wafer W, for example, from a discharge nozzle and the wafer W is rotated to diffuse the treatment solution over the front surface of the wafer W.

For example, in the second block G2, as illustrated in FIG. 3, a plurality of thermal treatment modules 40 are provided to line up in the vertical direction (up-down direction in the drawing) and the width direction (Y-direction in the drawing). The number and the arrangement of the thermal treatment modules 40 can also be arbitrarily selected.

For example, at least some of the thermal treatment modules 40 are made by coupling a heating part for heating the wafer W and a cooling part for cooling the substrate W. In the thermal treatment module 40, the heating part has a hot plate 41 and the cooling part cools a cooling plate 42 as illustrated in FIG. 1. The hot plate 41 is configured such that the wafer W is mounted thereon and a heating means such as a resistance heater is provided therein, and the cooling plate 42 is configured such that the wafer W is mounted thereon and a cooling means such as a flow path for a cooling refrigerant is provided therein.

Further, for example, some of the thermal treatment modules function as energy appliers each of which applies energy to the metal-containing resist film.

In the treatment block BL1, as illustrated in FIG. 1, a transfer path R1 extending in the width direction is provided at a portion between the first block G1 and the second block G2. In the treatment block BL1, the plurality of developing modules 30 and the plurality of resist coating modules 31 are arranged in a manner to line up along the transfer path R1 extending in the width direction. In the transfer path R1, a transfer module R2 for transferring the wafer W is arranged.

The transfer module R2 has a transfer arm R2*a* movable, for example, in the width direction (Y-direction in FIG. 1), the vertical direction, and the direction around the vertical axis. The transfer module R2 can move the transfer arm R2*a* holding the wafer W in a wafer transfer region D to transfer the wafer W to a predetermined apparatus in the first block G1, the second block G2, and the later-explained delivery tower 50 and delivery tower 60 which are located therearound. A plurality of the transfer modules R2 are arranged, for example, one above the other as illustrated in FIG. 3, and can transfer the wafers W, for example, to predetermined modules at similar heights in the first block G1, the second block G2, and the delivery towers 50, 60.

Further, in the transfer path R1, a shuttle transfer module R3 is provided which linearly transfers the wafer W between the delivery tower 50 and the delivery tower 60.

The shuttle transfer module R3 can linearly move the supported wafer W in the Y-direction to transfer the wafer W between the apparatus in the delivery tower 50 and the apparatus in the delivery tower 60 at the similar heights.

In the delivery block BL2, as illustrated in FIG. 1, the delivery tower 50 is provided at the middle portion in the depth direction (X-direction in the drawing). The delivery tower 50 is concretely provided at a position, in the delivery block BL2, adjacent to the transfer path R1 in the treatment block BL1 in the width direction (Y-direction in the drawing). In the delivery tower 50, as illustrated in FIG. 3, a plurality of delivery modules 51 are provided in a manner to be stacked in the vertical direction.

The interface station 12 is provided between the treatment station 11 and the exposure apparatus E as illustrated in FIG. 1 and delivers the wafer W between them.

At a position, in the interface station 12, adjacent to the transfer path R1 in the treatment block BL1 in the width direction (Y-direction in the drawing), the delivery tower 60 is provided. In the delivery tower 60, as illustrated in FIG. 3, a plurality of delivery modules 61 are provided in a manner to be stacked in the vertical direction.

Further, as illustrated in FIG. 1, a transfer module R4 is provided in the interface station 12.

The transfer module R4 is provided at a position adjacent to the delivery tower 60 in the width direction (Y-direction in the drawing), and has a transfer arm R4*a* which is movable, for example, in the depth direction (X-direction in FIG. 1), the vertical direction, and the direction around the vertical axis. The transfer module R4 can transfer the wafer W between the plurality of delivery modules 61 in the delivery tower 60 and the exposure apparatus E while holding the wafer W by the transfer arm R4*a*.

The delivery block BL2 of the treatment station 11 further has, as illustrated in FIG. 1, a delivery tower 52 at an end portion on the deep side (X-direction positive side in the drawing).

The delivery tower 52 has a delivery module 53 as illustrated in FIG. 4. In the delivery tower 52, a plurality of the delivery modules 53 may be provided in a manner to be stacked in the vertical direction (up-down direction in FIG. 4).

Further, the delivery tower 52 may have a cooling module 54 which cools the wafer.

Furthermore, as illustrated in FIG. 1, a transfer module R5 is provided in the delivery block BL2. The transfer module R5 is provided between the delivery tower 50 and the delivery tower 52, and has a transfer arm R5*a* which is movable, for example, in the vertical direction and the direction around the vertical axis. The transfer module R5 can transfer the wafer W between the plurality of delivery modules 51 in the delivery tower 50 and the plurality of delivery modules 53 and the cooling module 54 in the delivery tower 52 while holding the wafer W by the transfer arm R5*a*.

The dry treatment part 3 has, as illustrated in FIG. 1, for example, a load lock station 100 and a treatment station 101. In the dry treatment part 3, the load lock station 100 and the treatment station 101 are integrally connected. In this example, a coupling direction of the load lock station 100 and the treatment station 101 and the coupling direction of the wet treatment part 2 and the exposure apparatus E are perpendicular to each other in top view.

In the load lock station 100, a load lock module 110 is provided which is configured such that the atmosphere therein can be switched between a reduced-pressure atmosphere and an atmospheric-pressure atmosphere.

The treatment station 101 has a vacuum transfer chamber 120 and a treatment module 121.

The vacuum transfer chamber 120 is composed of a housing configured to be sealable, and its inside is kept in a reduced-pressure state (vacuum state). The vacuum transfer chamber 120 is formed, for example, in an almost polygonal shape (pentagon in the example in the drawing) in top view.

A plurality of (four, in the example in the drawing) treatment modules 121 are provided, for example, in the treatment station 101. At least one of the treatment modules 121 provided in the treatment station 101 is a dry developing part which performs in a dry mode the developing treatment performed by the developing module 30 in the wet treatment part 2. The wet mode is a mode using liquid, whereas the dry mode is a mode using gas, specifically, a mode using gas under a reduced pressure. It can also be said that the dry treatment is intended to obtain an action that is the purpose of the treatment mainly with gas, and the wet treatment is intended to obtain the action mainly with liquid.

In the treatment station 101, the plurality of treatment modules 121 and the load lock station 100 are arranged outside the vacuum transfer chamber 120, for example, in a manner to surround the vacuum transfer chamber 120 in top view, namely, in a manner to be arranged side by side around the vertical axis passing through the center portion of the vacuum transfer chamber 120.

Further, inside the vacuum transfer chamber 120, a transfer module 122 which transfers the wafer W is provided. The transfer module 122 has a transfer arm 122*a* movable, for example, in the direction around the vertical axis. The transfer module 122 can transfer the wafer W between the plurality of treatment modules 121 and the load lock module 110 while holding the wafer W by the transfer arm 122*a*.

The relay transfer part 4 transfers the wafer W between the wet treatment part 2 and the dry treatment part 3, specifically, transfers the wafer W in units of a wafer, namely, a single wafer manner.

The relay transfer part 4 has a transfer path 130 provided therein, and transfers the wafer W between the wet treatment part 2 and the dry treatment part 3 via the transfer path 130. The transfer path 130 in the relay transfer part 4 constitutes a transfer route extending in the depth direction (X-direction in the drawing) including the delivery tower 50 and so on in the delivery block BL2.

In this embodiment, the relay transfer part 4 is connected to a portion, of the wet treatment system 2, farther away from the exposure apparatus E than the treatment block BL1, specifically, connected to the delivery block BL2. More specifically, the relay transfer part 4 has the transfer path 130 connected to the delivery block BL2.

In the transfer path 130, a transfer module 131 which transfers the wafer W is provided.

The transfer module 131 has a transfer arm 131*a* movable, for example, in the vertical direction and the direction around the vertical axis. The transfer module 131 can transfer the wafer W between the plurality of delivery modules 53 and the cooling module 54 in the delivery tower 52 and the load lock module 110 while holding the wafer W by the transfer arm 131*a*.

Further, the wafer treatment apparatus 1 has a controller 5 which performs control of the wafer treatment apparatus 1 including control of the transfer apparatuses. The controller 5 is a computer including, for example, a processor such as a CPU and a memory, and has a program storage (not illustrated). In the program storage, a program for controlling a later-explained wafer treatment by controlling the operations of the drive systems of the above various treatment apparatuses, various transfer apparatuses and so on is stored. Note that the above program may be the one recorded in a non-transitory computer-readable storage medium H and installed from the storage medium H into the controller 5. The storage medium H may be a transitory one or a non-transitory one.

Note that in the wafer treatment apparatus 1, the wet treatment part 2 is arranged such that the exposure apparatus E projects to the deep side from the deep side (X-direction positive side in the drawing) of the wet treatment part 2. Further, in the wafer treatment apparatus 1, the dry treatment part 3 is arranged adjacent to the deep side (X-direction positive side in the drawing) of the wet treatment part 2 in the depth direction.

<Example 1 of the Wafer Treatment>

Next, the wafer treatment using the wafer treatment apparatus 1 will be explained.

In the wafer treatment using the wafer treatment apparatus 1, for example, only one of the dry developing treatment and the wet developing treatment is performed once. In following Example 1 of the wafer treatment, only the dry developing treatment is performed once.

Figure 5:
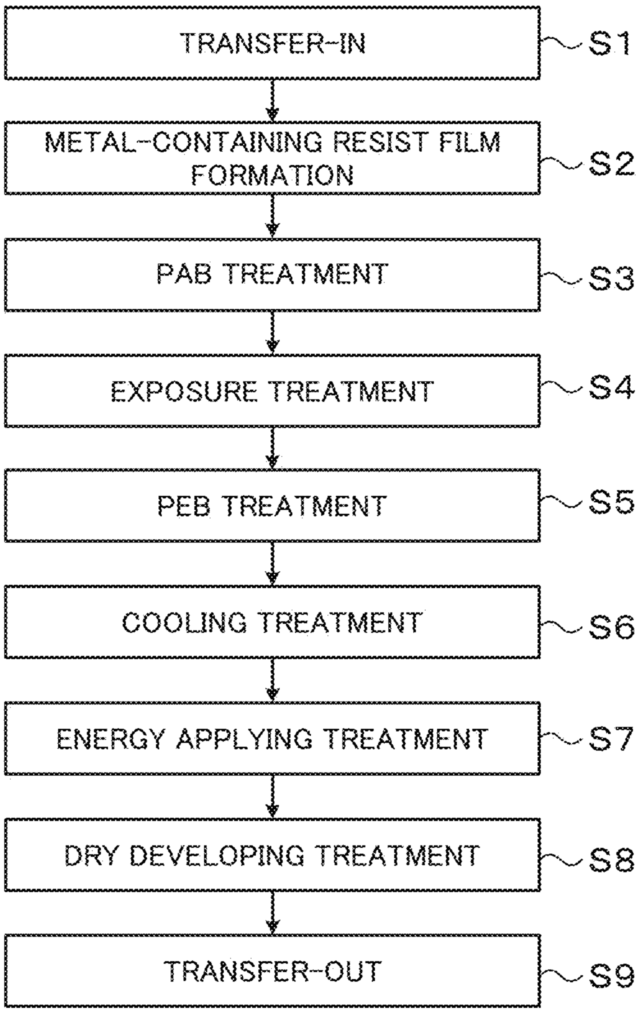
FIG. 5 is a flowchart illustrating main processes of Example 1 of a wafer treatment using the wafer treatment apparatus in FIG. 1.

FIG. 5 is a flowchart illustrating main processes of Example 1 of the wafer treatment using the wafer treatment apparatus 1. Example 1 of the wafer treatment is performed under the control of the controller 5.

In Example 1 of the wafer treatment in which only the dry developing treatment is performed once, the wafer W is first transferred into the wafer treatment apparatus 1 (Step S1)

Specifically, for example, the wafer W is first taken out of the cassette C on the cassette stage 20 by the transfer module 23 in the wet treatment part 2, and transferred to the delivery module 51 in the delivery tower 50 in the delivery block BL2.

Next, the resist coating treatment is performed, whereby a metal-containing resist film is formed on the wafer W (Step S2).

Specifically, for example, the wafer W is transferred by the transfer module R2 to the resist coating apparatus 31 in the treatment block BL1, and the metal-containing resist is applied to the front surface of the wafer W with rotation, whereby the metal-containing resist film is formed in a manner to cover the front surface of the wafer W.

Then, a pre-exposure heating (PAB: Pre-Applied Bake) treatment is performed (Step S3).

Specifically, the wafer W is transferred to the thermal treatment apparatus 40 for the PAB treatment, and a heat treatment is performed on the wafer W. Thereafter, the wafer W is transferred to the delivery module 61 in the delivery tower 60 in the interface station 12.

Subsequently, an exposure treatment is performed (Step S4).

Specifically, for example, the wafer W is transferred by the transfer module R4 to the exposure apparatus E, and the metal-containing resist film on the wafer W is exposed in a predetermined pattern using EUV light. Thereafter, the wafer W is transferred by the transfer module R4 to the delivery module 61 in the delivery tower 60.

Next, a post-exposure heat treatment (PEB (Post Exposure Bake) treatment) is performed (Step S5).

Specifically, the wafer W is transferred by the transfer module R2, for example, to the thermal treatment module 40 for the PEB treatment, and a heat treatment using the hot plate 41 is performed on the wafer W.

When a ligand of a metal complex (specifically, a tin complex) is removed, namely, a deprotection reaction occurs and the metal complex with the ligand removed therefrom causes a condensation reaction, the metal-containing resist becomes a metal oxide film (specifically, a tin oxide film) to be insoluble to the developing solution in a negative developing treatment.

In the PEB treatment, for example, both of the deprotection reaction and the condensation reaction progress in an exposed region where the metal-containing resist has been exposed. It is considered that the progresses of the reactions vary depending on the position in the exposed region and there are a portion where the deprotection reaction occurs and a portion where the condensation reaction occurs at a certain timing. When the metal-containing resist coming into the state before the condensation reaction due to the occurrence of the deprotection reaction is rephrased as precursor formation, it can be said that the precursor formation and the condensation reaction can be made to progress in the PEB treatment. Besides, the temperature of the wafer W during the PEB treatment is, for example, 160° C. to 180° C.

Subsequently, the cooling treatment is performed to suppress the precursor formation of the metal-containing resist film (Step S6).

Specifically, for example, the wafer W is transferred from the top of the hot plate 41 onto the cooling plate 42 in the thermal treatment module 40 for the PEB treatment, and a cooling treatment using the cooling plate 42 is performed on the wafer W. The cooling treatment stops or suppresses further progress of the deprotection reaction of the deprotection reaction and the condensation reaction which are reactions in the metal-containing resist film (specifically, in the exposed region).

In the cooling treatment, the wafer W is cooled, for example, to a temperature before the PEB treatment, specifically, to room temperature, more specifically, to 20° C. to 25° C.

Subsequently, an energy applying treatment is performed to apply energy to the metal-containing resist film after the cooling treatment, and the condensation reaction in the metal-containing resist film improves the selectivity of the metal-containing resist film during the development (Step S7).

Specifically, for example, the wafer W is transferred to the thermal treatment module 40 for the energy applying treatment, and a heat treatment as the energy applying treatment is performed on the wafer W. Both the energy applying treatment at this Step S7 and the PEB treatment at above Step S5 are heat treatments. In the energy applying treatment at this Step S7, the further progress of the deprotection is stopped or suppressed by the cooling treatment performed preceding thereto, so that the condensation reaction is selectively accelerated as the reaction in the metal-containing resist film (specifically, in the exposed region) in the energy applying treatment at this Step S7. In other words, only the condensation reaction is accelerated as the reaction in the metal-containing resist film, or the condensation reaction is more dominantly accelerated than the deprotection reaction. As a result, the metal oxide film formation progresses to improve the selectivity of the metal-containing resist film during the development, namely, a removal speed ratio of an unexposed region to the exposed region during the development time.

Note that the temperature of the wafer W during the heat treatment as the energy applying treatment is, for example, 180° C. to 250° C.

Thereafter, a dry developing treatment is performed (Step S8).

Specifically, for example, the wafer W is first transferred by the transfer module R2 to the delivery module 51 in the delivery tower 50 in the delivery block BL2. Next, the wafer W is transferred by the transfer module R5 to the delivery module 53 in the delivery tower 52. Subsequently, the wafer W is transferred by the transfer module 131 in the relay transfer part 4 via the transfer path 130 to the load lock module 110 in the dry treatment part 3. Subsequently, after the inside of the load lock module 110 is reduced in pressure, the wafer W is transferred by the transfer module 122 to a predetermined treatment module 121 and subjected to a dry developing treatment using a treatment gas under a reduced-pressure atmosphere.

Then, the wafer W is transferred out of the wafer treatment apparatus 1 (Step S9).

Specifically, for example, the wafer W is first returned to the load lock module 110. Subsequently, the inside of the load lock module 110 is returned to the atmospheric-pressure atmosphere, and the wafer W is thereafter transferred by the transfer module 131 in the relay transfer part 4 via the transfer path 130 to the cooling module 54 in the delivery tower 52 in the delivery block BL2 and cooled to almost room temperature. Thereafter, the wafer W is transferred by the transfer module R5 to the delivery module 51 in the delivery tower 50 in the delivery block BL2. Then, the wafer W is returned by the transfer module 23 to the cassette C on the cassette stage 20.

With this, the wafer treatment is completed.

Note that all of the heat treatments as the PAB treatment, the PEB treatment, and the energy applying treatment, and a later-explained post bake treatment are heat treatments for heating the wafer W, but the thermal treatment modules 40 provided for the heat treatments are different from one another in an embodiment.

Main Operation and Effect of this Embodiment

Figure 6:
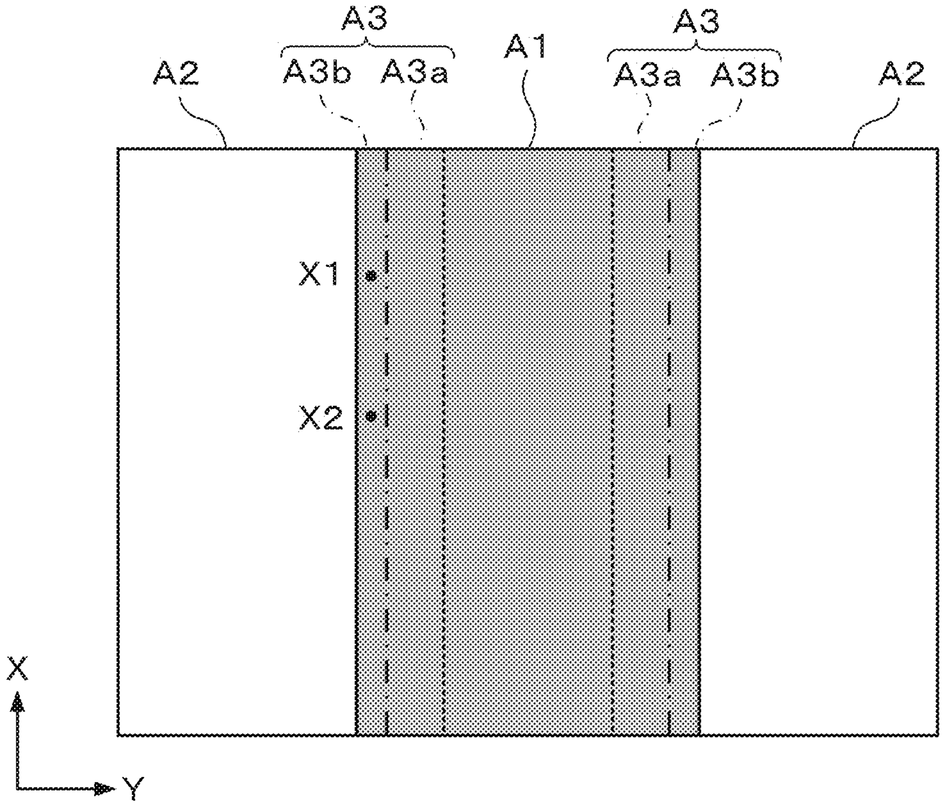
FIG. 6 is a view for explaining an intermediately exposed region.

Next, the main operation and effect of this embodiment will be explained using FIG. 6. FIG. 6 is a view for explaining a later-explained intermediately exposed region, and is a partially enlarged top view schematically illustrating the metal-containing resist film after exposure. Note that the operation and effect of this embodiment will be explained below using the case of performing negative development on the metal-containing resist film as an example, but the usage of this embodiment is not limited to the negative development. Portions explained regarding the developing treatment in the following paragraphs also take the negative development as an example.

The present inventors have earnestly carried out tests and found that the following problems exist in a form (hereinafter, comparative form) in which the exposure treatment, the PEB treatment, and the developing treatment are performed in sequence without performing the cooling treatment and the heat treatment as the energy applying treatment, unlike this embodiment.

In the tests earnestly carried out by the present inventors, in the comparison form, if the time of the PEB treatment is short or the PEB treatment temperature is low, the surface roughness of the pattern of the metal-containing resist is excellent but the selectivity of the metal-containing resist during the development is low. If the selectivity of the metal-containing resist during the development is low, a pattern with desired dimensions (specifically, for example, a desired thickness or height and a desired line width or hole diameter) cannot be obtained. Further, in the comparison form, if the time of the PEB treatment is long or the PEB treatment temperature is high, the selectivity is excellent but the roughness deteriorates. As explained above, it is found that the comparison form has such a problem that a pattern of the metal-containing resist excellent in surface roughness and high in selectivity during the development cannot be obtained, namely, such a problem that the surface roughness deteriorates when the selectivity during the development is tried to improve.

The conceivable reasons of the problem are as follows.

The exposure activates the reaction in the metal-containing resist film, and the reaction mainly activated by the exposure is the deprotection reaction of the deprotection reaction and the condensation reaction.

Besides, in the metal-containing resist film, an intermediately exposed region A3 which is exposed but whose exposure amount is smaller than that at the center of an exposed region A1 exists in a region close to an unexposed region A2 in the exposed region A1 which has been exposed as illustrated in FIG. 6. In this intermediately exposed region A3, the exposure amount, that is, the deprotection reaction amount during the exposure time gradually decreases toward the unexposed region A2.

However, in a region of the intermediately exposed region A3 on the center side of the exposed region A1, that is, an inner side region A3*a*, the exposure amount is sufficient, so that the exposure amount is almost equal between a plurality of portions different from each other located in the inner side region A3*a*.

On the other hand, in a region of the intermediately exposed region A3 close to the unexposed region A2, that is, an outer side region A3*b*, the exposure amount is slightly insufficient or greatly insufficient, so that the exposure amount is different between a plurality of portions different from each other located in the outer side region A3*b*. For example, in the case where exposure for pattern formation of a line-and-space is performed, a point X1 and a point X2 in FIG. 6 are both located in the outer side region A3*b* of the intermediately exposed region A3 and are different from each other in position in the length direction (X-direction in the drawing), and the exposure amounts at the point X1 and the point X2 are different in some cases. Specifically, the exposure amount is slightly insufficient at the point X1 and the exposure amount is greatly insufficient at the point X2 in some cases, that is, the deprotection reaction amount during the exposure is slightly insufficient at the point X1 and the deprotection reaction amount during the exposure is greatly insufficient at the point X2 in some cases.

Therefore, if the time of the PEB treatment is shortened or the PEB treatment temperature is lowered in the comparison form, the deprotection reaction during the PEB treatment is suppressed, so that the deprotection reaction amount until the development becomes insufficient in regions in the outer side region A3*b* of the intermediately exposed region A3, and the whole outer side region A3*b* is removed by the development, resulting in excellent surface roughness of the pattern after the development. However, if the time of the PEB treatment is shortened or the PEB treatment temperature is lowered, not only the deprotection reaction but also the condensation reaction are suppressed. Therefore, the condensation reaction amount until the development decreases, that is, the oxide film formation and the densification of the metal-containing resist film do not sufficiently progress in the regions in the exposed region A1 of the metal-containing resist film, resulting in lowered selectivity of the metal-containing resist film during the development.

On the other hand, if the time of the PEB treatment is lengthened or the PEB treatment temperature is raised, the condensation reaction amount until the development increases in the regions in the exposed region A1 of the metal-containing resist film, so that the oxide film formation and the densification of the metal-containing resist film progress, resulting in improved selectivity of the metal-containing resist film during the development. However, if the time of the PEB treatment is lengthened or the PEB treatment temperature is raised, not only the condensation reaction but also the deprotection reaction progress. Therefore, only some regions are sufficient in the deprotection reaction amount until the development in the outer side region A3*b* of the intermediately exposed region A3, and are not removed by the development but remain, resulting in that the surface roughness of the pattern after the development deteriorates. For example, in the case where the deprotection reaction amount until the development is sufficient due to the PEB treatment for a long time at the point X1 in FIG. 6 where the deprotection reaction amount during the exposure is slightly insufficient and the deprotection reaction amount until the development is insufficient even by the PEB treatment for a long time at the point X2 where the deprotection reaction amount during the exposure is greatly insufficient, the portion at the point X1 is removed by the development but the portion at the point X2 remains even after the development.

The above is considered as the reasons for the occurrence of the above problem.

Based on the above, after the exposure treatment and the PEB treatment are performed in sequence, the cooling treatment and the heat treatment as the energy applying treatment are performed and then the developing treatment is performed in this embodiment.

By the cooling treatment performed after the PEB treatment, further progress of the deprotection reaction in the metal-containing resist film is suppressed or stopped.

Further, the deprotection reaction is a reaction which progresses in a chain, so that once the progress of the deprotection reaction is stopped or suppressed by the cooling, the progress of the deprotection reaction becomes relatively slow as compared with the condensation reaction even if energy is applied thereafter.

Therefore, the heat treatment as the energy applying treatment performed subsequent to the cooling treatment in this embodiment accelerates only the condensation reaction as the reaction in the metal-containing resist film or more dominantly accelerates the condensation reaction than the deprotection reaction.

As a result, it is possible to make the condensation reaction amount until the development in the regions in the exposed region A1 sufficient while keeping the deprotection reaction amount until the development insufficient in the regions in the outer side region A3*b* of the intermediately exposed region A3. Accordingly, the whole intermediately exposed region A3 is removed by the development and the densification of the whole exposed region A1 progresses, resulting in that the surface roughness of the pattern after the development becomes excellent and the selectivity of the metal-containing resist film during the development is improved. Further, because the selectivity of the metal-containing resist film during the development is improved, the pattern of the metal-containing resist with desired dimensions can be obtained.

As explained above, according to this embodiment, an excellent pattern of the metal-containing resist, specifically, a pattern of the metal-containing resist with excellent surface roughness and desired dimensions can be formed.

Further, according to this embodiment, the metal-containing resist film after the thermal treatment as the energy applying treatment is insusceptible to the ambient atmosphere because the metal oxide film formation has been almost completed. Therefore, even if a leave time after the finish of the thermal treatment as the energy applying treatment to the start of the developing treatment (specifically, the dry developing treatment) is long, an excellent pattern of the metal-containing resist can be formed.

Further, in this embodiment, the process of the cooling treatment at Step S6 and the process of the energy applying treatment at Step S7 are successively performed without other treatment processes intervening between them. Accordingly, it is possible to prevent the metal-containing resist film on the wafer W from being affected by the time required for the other treatment processes and the atmosphere around the wafer W during the other treatment processes. Therefore, a better metal-containing resist pattern can be formed.

<Example 2 of the Wafer Treatment>

Figure 7:
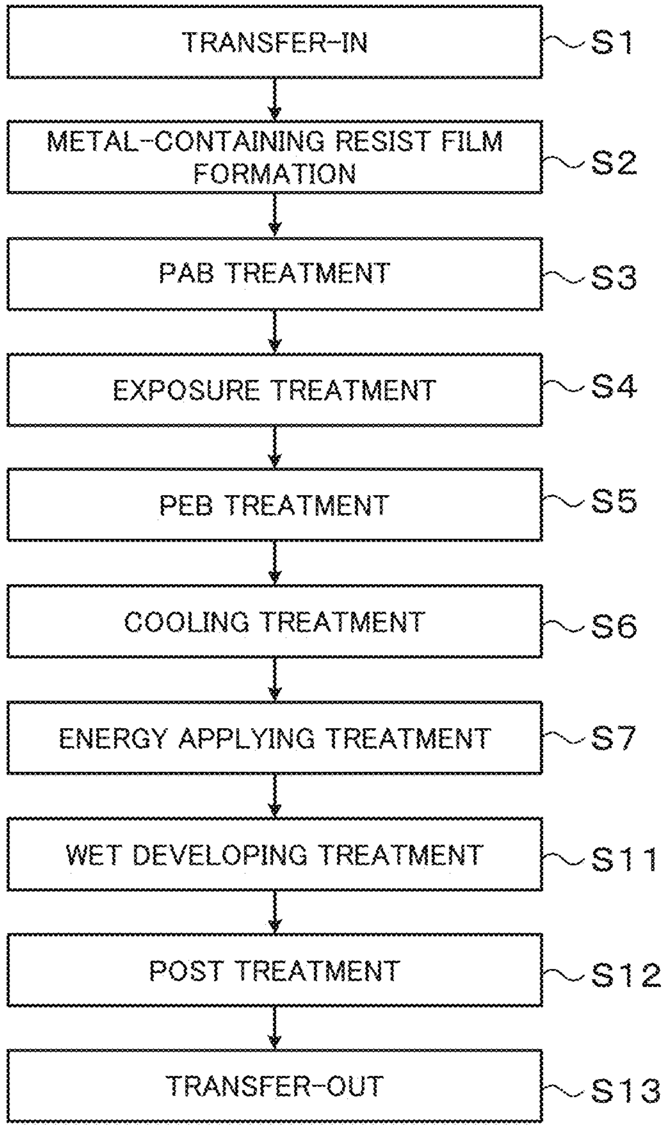
FIG. 7 is a flowchart illustrating main processes of Example 2 of the wafer treatment using the wafer treatment apparatus in FIG. 1.

FIG. 7 is a flowchart illustrating main processes of Example 2 of the wafer treatment using the wafer treatment apparatus 1. Example 2 of the wafer treatment is performed under the control of the controller 5.

Though only the dry developing treatment is performed once in above Example 1 of the wafer treatment, only the wet developing treatment is performed once in this example.

In this example, as illustrated in FIG. 7, for example, Step S1 to Step S7 are performed first as in above Example 1 of the wafer treatment.

After the energy applying treatment at above Step S7, the wet developing treatment is performed (Step S11).

Specifically, for example, the wafer W after the thermal treatment as the energy applying treatment is transferred by the transfer module R2 to the developing module 30, and the wet developing treatment using a developing solution is performed on the wafer W.

Thereafter, a post baking treatment (hereinafter, POST treatment) of heat-treating the wafer W after the developing treatment is performed (Step S12).

Specifically, the wafer W is transferred to the thermal treatment module 40 for the POST treatment and the POST treatment is performed on the wafer W Then, the wafer W is transferred out of the wafer treatment apparatus 1 (Step S13).

Specifically, the wafer W is returned to the cassette C in the procedure reverse to that at Step S1.

With this, the wafer treatment is completed.

Also in this example, the process of the cooling treatment at Step S6 and the process of the energy applying treatment at Step S7 are performed as in above Example 1 of the wafer treatment, so that it is possible to form an excellent pattern of the metal-containing resist, specifically, a pattern of the metal-containing resist with excellent surface roughness and desired dimensions.

<Other Effects and so on of Example 1 and Example 2 of the Wafer Treatment>

In the wafer treatment apparatus 1, Example 1 and Example 2 of the wafer treatment can be performed in parallel.

Further, in the wafer treatment apparatus 1, the treatments until the energy applying treatment at Step S7 are performed in the wet treatment part 2 in both Example 1 and Example 2 of the wafer treatment. Specifically, the treatments until the energy applying treatment, namely, the treatments just before the developing treatment are performed in the wet treatment part 2 in both Example 1 and Example 2 of the wafer treatment. The metal-containing resist film on the wafer W is affected in the finally obtained pattern shape and in selectivity by the atmosphere around the wafer W (gas component kind, humidity, or the like) during the time when the treatments until the energy applying treatment are performed and during the transfer until the energy applying treatment. However, the treatments until the energy application are performed in the wet treatment part 2 irrespective of Example 1 or Example 2 of the wafer treatment as explained above. Therefore, the states of the atmosphere around the wafer W until the energy applying treatment are similar between Example 1 and Example 2 of the wafer treatment, so that the states of the resist film on the wafer W at the start of the developing treatment can be made similar to each other. In other words, the states of the resist film on the wafer W at the start of the developing treatment can be made close to each other between the case of performing the dry developing treatment only once and the case of performing the wet developing treatment only once.

Note that in the case where Example 1 and Example 2 of the wafer treatment are performed in parallel and the (shortest) time required for the whole wafer treatment differs between Example 1 and Example 2 of the wafer treatment, if the thermal treatment module 40 to be used for the energy applying treatment is shared between Example 1 and Example 2 of the wafer treatment, for example, the following problem may arise. Specifically, the transfer schedule in the case of performing Example 1 of the wafer treatment and the transfer schedule in the case of performing Example 2 of the wafer treatment are affected by each other. In this case, the time required for the treatments until the energy application differs among the wafers W on which Example 1 of the wafer treatment is performed, and the time required for the treatments until the energy application differs also among the wafers W on which Example 2 of the wafer treatment is performed.

Accordingly, the thermal treatment module 40 to be used for the energy applying treatment is not shared between the case of performing Example 1 of the wafer treatment and the case of performing Example 2 of the wafer treatment, but separate thermal treatment modules 40 may be used for them. This can prevent the transfer schedule in the case of performing Example 1 of the wafer treatment and the transfer schedule in the case of performing Example 2 of the wafer treatment from being affected by each other. In other words, it is possible to manage the transfer schedules of substrates separately between the treatment of performing the dry developing treatment only once and the treatment of performing the wet developing treatment only once. Accordingly, it is possible to equalize the time required for the treatments until the energy application among the wafers W on which Example 1 of the wafer treatment is performed, and to equalize the time required for the treatments until the energy application also among the wafers W on which Example 2 of the wafer treatment is performed. In other words, it is possible to equalize the time required for the treatments until the energy application among the wafers W being objects of a treatment in which the dry developing treatment is performed only once, and to equalize the time required for the treatments until the energy application among the wafers W being objects of a treatment in which the wet developing treatment is performed only once.

<Example 3 of the Wafer Treatment>

In above Examples 1, 2 of the wafer treatment, the number of times of the developing treatment performed on the wafer W is one, and one of the wet developing treatment and the dry developing treatment is performed on the wafer W. In the wafer treatment using the wafer treatment apparatus 1, the number of times of the developing treatment performed on the wafer W may be plural, in which case both of the wet developing treatment and the dry developing treatment may be performed on the wafer W. In following Examples 3 to 5 of the wafer treatment, the number of times of the developing treatment performed on the wafer W for pattern formation is two, and the wet developing treatment is performed first and the dry developing treatment is performed later. Further, in the following Examples 3 to 5 of the wafer treatment, the wet developing treatment performed first forms an approximate shape of the pattern of the metal-containing resist, and the dry developing treatment performed later forms a fine pattern of the metal-containing resist. In the dry developing treatment not using liquid, no liquid enters between patterns, so that pattern collapse due to surface tension of the liquid never occurs in the fine pattern of the metal-containing resist. Therefore, in the following Examples 3 to 5 of the wafer treatment, the defect of the pattern collapse can be suppressed.

Further, in the following Examples 3 to 5 of the wafer treatment, the developing treatment is performed twice on the wafer W as explained above, and the cooling treatment that is the treatment of suppressing the deprotection reaction of the metal-containing resist film and the energy applying treatment that is the treatment of accelerating the condensation reaction of the metal-containing resist film are performed either before the developing treatment for the first time or before the developing treatment for the second time. In order to improve the productivity by suppressing the number of processes, the energy applying treatment may be performed only either before the developing treatment for the first time or before the developing treatment for the second time, as in the following Examples 3 to 5 of the wafer treatment.

Figure 8:
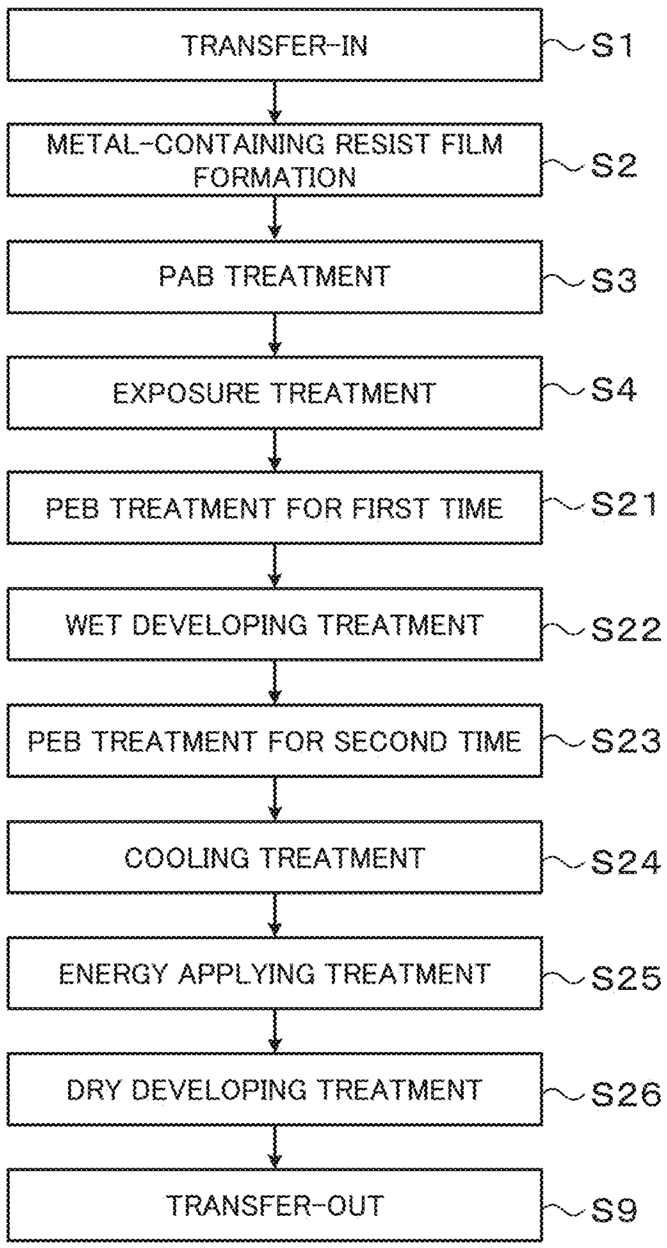
FIG. 8 is a flowchart illustrating main processes of Example 3 of the wafer treatment using the wafer treatment apparatus in FIG. 1.

FIG. 8 is a flowchart illustrating main processes of Example 3 of the wafer treatment using the wafer treatment apparatus 1. Example 3 of the wafer treatment is performed under the control of the controller 5.

In this example, as illustrated in FIG. 8, for example, Step S1 to Step S4 are performed first as in above Example 1 and so on of the wafer treatment.

After the exposure treatment at above Step S4, the PEB treatment for the first time is performed (Step S21).

Specifically, for example, the wafer W is transferred by the transfer module R2 to the thermal treatment apparatus 40 for the PEB treatment for the first time and the heat treatment using the hot plate 41 is performed on the wafer W as at above Step S5. This accelerates, for example, both the deprotection reaction and the condensation reaction in the metal-containing resist film (specifically, in the exposed region).

Then, as the developing treatment for the first time, the wet developing treatment is performed (Step S22).

Specifically, for example, the wafer W is transferred by the transfer module R2 to the developing module 30, and the wet developing treatment using a developing solution is performed on the wafer W as at above Step S11. However, by this developing treatment, a pattern of the metal-containing resist with desired dimensions is not formed but, for example, a resist pattern in which the whole exposed region A1 including at least the above intermediately exposed region A3 remains and which has a thick line width (or large hole diameter) is formed.

Next, the PEB treatment for the second time is performed (Step S23).

Specifically, for example, the wafer W is transferred by the transfer module R2 to the thermal treatment apparatus 40 for the PEB treatment for the second time and the heat treatment using the hot plate 41 is performed on the wafer W as at above Step S5.

This accelerates both the deprotection reaction and the condensation reaction in the metal-containing resist film (specifically, in the exposed region) which remains in the developing treatment for the first time.

Subsequently, the cooling treatment is performed to suppress the reaction in the metal-containing resist film after the developing treatment for the first time (Step S24).

Specifically, for example, the wafer is moved from the top of the hot plate 41 to the top of the cooling plate 42 in the thermal treatment module 40 for the PEB treatment for the second time, and a cooling treatment using the cooling plate 42 is performed on the wafer W as at above Step 6. This cooling treatment stops or suppresses further progress of the deprotection reaction of the deprotection reaction and the condensation reaction which are reactions in the metal-containing resist film (specifically, in the exposed region) which remains in the developing treatment for the first time.

Next, the energy applying treatment is performed to apply energy to the metal-containing resist film after the developing treatment for the first time and cooling treatment to improve the selectivity of the metal-containing resist film during the development for the second time (Step S25).

Specifically, for example, the wafer W is transferred to the thermal treatment module 40 for the energy applying treatment and a heat treatment as the energy applying treatment is performed on the wafer W as at above Step S7. This selectively accelerates the condensation reaction as a reaction in the metal-containing resist film (specifically, in the exposed region) which remains in the developing treatment for the first time. As a result, it is possible to improve the selectivity of the metal-containing resist film during the development for the second time while suppressing the deprotection reaction and the condensation reaction in the outer side region A3*b* of the above intermediately exposed region A3 in the metal-containing resist film.

Thereafter, as the developing treatment for the second time, the dry developing treatment is performed (Step S26).

Specifically, for example, the wafer W is transferred to the predetermined treatment module 121 in the dry treatment part 3 and subjected to the dry developing treatment using the treatment gas under the reduced-pressure atmosphere as at above Step S8. This removes, for example, the outer side region A3*b* of the above intermediately exposed region A3 and so on in the metal-containing resist film which remains in the developing treatment for the first time, thereby forming a pattern of the metal-containing resist with excellent surface roughness and desired dimensions.

Then, above Step S9 is performed, and the wafer W is transferred out of the wafer treatment apparatus 1.

With this, the wafer treatment is completed.

The example of this treatment is the process of making the line width larger than the target in the developing treatment for the first time, increasing the selectivity of the exposed region and the unexposed region to the developing solution in the PEB treatment for the second time, and adjusting the line width to the target one in the developing treatment for the second time, except Steps S24 and S25.

Further to this process, Steps S24 and S25, that is, the cooling treatment and the energy applying treatment are performed after the PEB treatment for the second time, thereby making it possible to adjust the line width to the target one by the development for the second time with the selectivity further increased while suppressing the factor of deteriorating the roughness of the line width.

<Example 4 of the Wafer Treatment>

Figure 9:
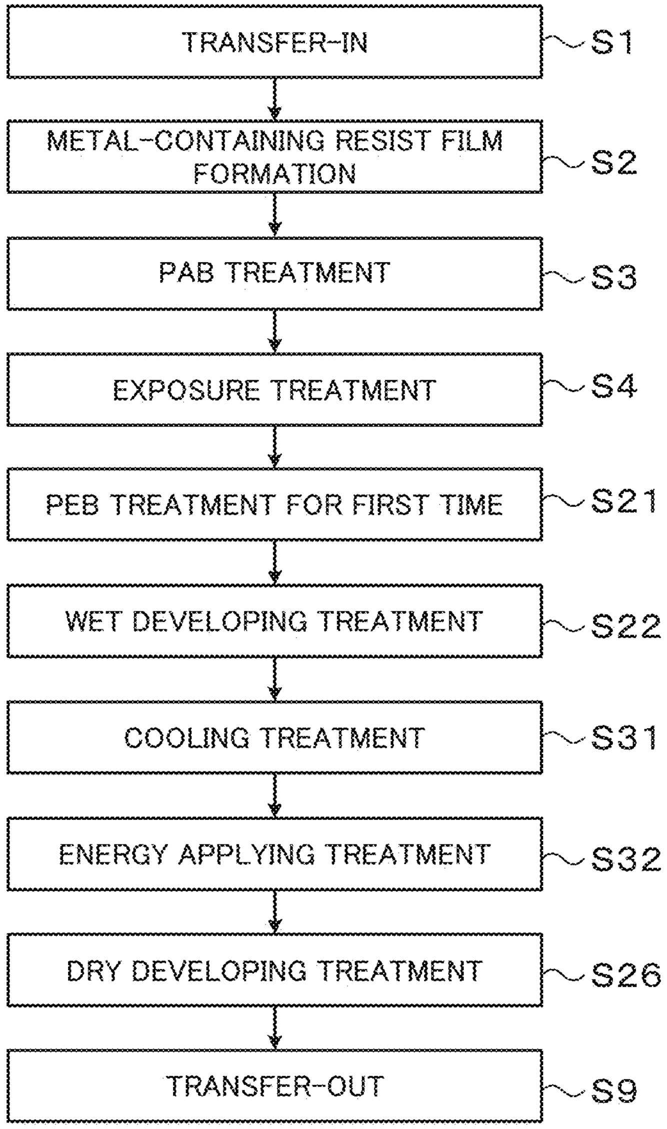
FIG. 9 is a flowchart illustrating main processes of Example 4 of the wafer treatment using the wafer treatment apparatus in FIG. 1.

FIG. 9 is a flowchart illustrating main processes of Example 4 of the wafer treatment using the wafer treatment apparatus 1. Example 4 of the wafer treatment is performed under the control of the controller 5.

In this example, as illustrated in FIG. 9, for example, Step S1 to Step S4, Step S21, and Step S22 are performed in sequence as in above Example 3 and so on of the wafer treatment.

After the wet developing treatment as the developing treatment for the first time at above Step S22, the cooling treatment is performed (Step S31).

Specifically, for example, the wafer W after the wet developing treatment is transferred to the thermal treatment apparatus 40 for the energy applying treatment at the subsequent stage, and the cooling treatment using the cooling plate 42 is performed on the wafer W. This cooling treatment stops or suppresses further progress of the deprotection reaction of the deprotection reaction and the condensation reaction which are reactions in the metal-containing resist film (specifically, in the exposed region) which remains in the developing treatment for the first time.

Next, the energy applying treatment is performed to apply energy to the metal-containing resist film after the developing treatment for the first time and cooling treatment to improve the selectivity of the metal-containing resist film during the development for the second time (Step S32).

Specifically, for example, the wafer W is moved from the top of the cooling plate 42 to the top of the hot plate 41 in the thermal treatment module 40 for the energy applying treatment, and the heat treatment using the hot plate 41 as the energy applying treatment is performed on the wafer W. This selectively accelerates the condensation reaction as a reaction in the metal-containing resist film (specifically, in the exposed region) which remains in the developing treatment for the first time. As a result, it is possible to improve the selectivity of the metal-containing resist film during the development for the second time while suppressing the deprotection reaction and the condensation reaction in the outer side region A3*b* of the above intermediately exposed region A3 in the metal-containing resist film.

Thereafter, above Step S26 and Step S9 are performed to form a pattern of the metal-containing resist with excellent surface roughness and desired dimensions on the wafer W, and then the wafer W is transferred out of the wafer treatment apparatus 1.

With this, the wafer treatment is completed.

The different point of the example of this treatment from Example 3 of the wafer treatment is that the cooling and the energy application are performed after the developing treatment for the first time and therefore the number of processes is smaller by the amount of the PEB treatment for the second time. In the case where sufficient selectivity can be obtained for the downstream manufacturing process by the energy applying treatment, the example of this treatment is useful as a method of achieving both the production efficiency and the process performance without increasing the number of processes too much. Note that the heat treatment may be performed after the energy applying process and before the development for the second time in this example to adjust the selectivity or the roughness.

<Example 5 of the Wafer Treatment>

Figure 10:
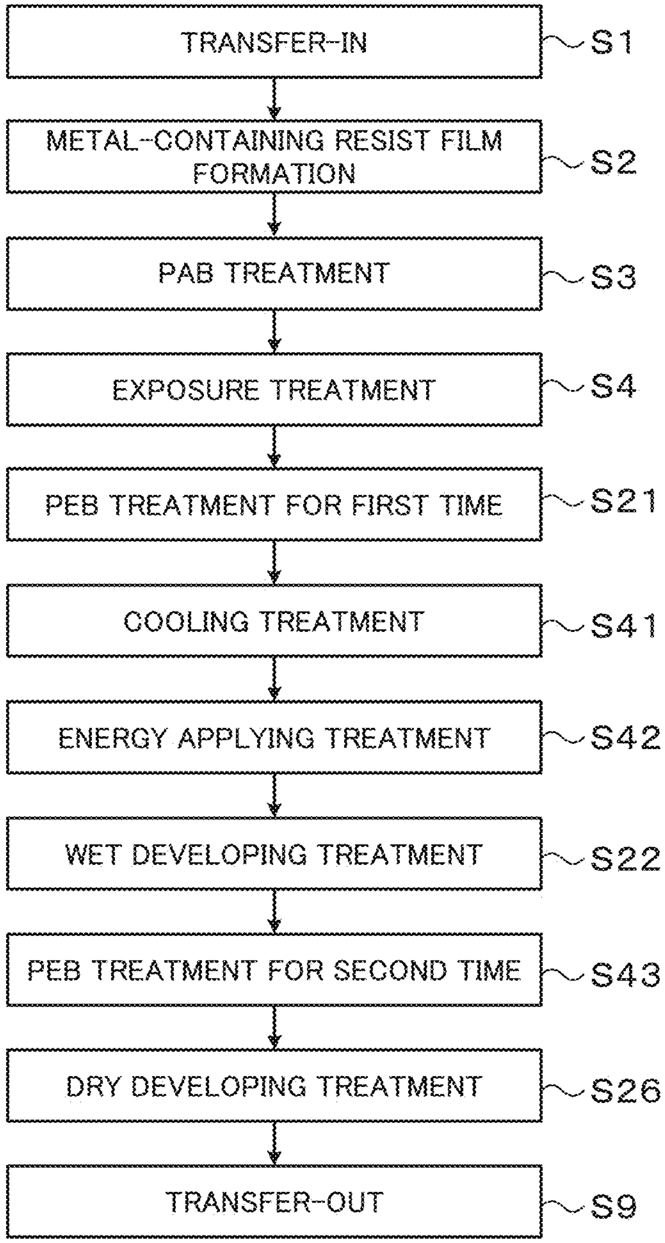
FIG. 10 is a flowchart illustrating main processes of Example 5 of the wafer treatment using the wafer treatment apparatus in FIG. 1.

FIG. 10 is a flowchart illustrating main processes of Example 5 of the wafer treatment using the wafer treatment apparatus 1. Example 5 of the wafer treatment is performed under the control of the controller 5.

In this example, as illustrated in FIG. 10, for example, Step S1 to Step S4, and Step S21 are performed in sequence as in above Example 3 and so on of the wafer treatment.

After the wet PEB treatment for the first time at above Step S21, the cooling treatment is performed (Step S41).

Specifically, for example, the wafer W is moved from the top of the hot plate 41 to the top of the cooling plate 42 in the thermal treatment module 40 for the PEB treatment for the first time, and the cooling treatment using the cooling plate 42 is performed on the wafer W as at above Step S24. This cooling treatment stops or suppresses further progress of the deprotection reaction of the deprotection reaction and the condensation reaction which are reactions in the metal-containing resist film (specifically, in the exposed region).

Next, the energy applying treatment is performed to apply energy to the metal-containing resist film after the cooling treatment to improve the selectivity of the metal-containing resist film during the development for the second time (Step S42).

Specifically, for example, as at above Step S7, the wafer W is transferred to the thermal treatment module 40 for the energy applying treatment, and the heat treatment as the energy applying treatment is performed on the wafer W. This selectively accelerates the condensation reaction as a reaction in the metal-containing resist film (specifically, in the exposed region). As a result, it is possible to improve the selectivity of the metal-containing resist film during the development for the second time while suppressing the condensation reaction in the outer side region A3*b* of the above intermediately exposed region A3 in the metal-containing resist film.

Subsequently, as above Step S22, namely, the wet developing treatment as the developing treatment for the first time is performed, whereby, for example, a resist pattern in which the whole exposed region A1 including at least the above intermediately exposed region A3 remains and which has a thick line width (or large hole diameter) is formed on the wafer W.

Next, the PEB treatment for the second time is performed (Step S43).

Specifically, for example, the wafer W is transferred by the transfer module R2 to the thermal treatment apparatus 40 for the PEB treatment for the second time and the heat treatment using the hot plate 41 is performed on the wafer W as at above Step S5.

Thereafter, above Step S26 and Step S9 are performed, whereby a pattern of the metal-containing resist with excellent surface roughness and desired dimensions is formed on the wafer W, and the wafer W is then transferred out of the wafer treatment apparatus 1.

With this, the wafer treatment is completed.

Modification Example and Concrete Example of the First Embodiment

Though the cooling part which performs the cooling treatment for suppressing the deprotection reaction in the metal-containing resist film is coupled to the heating part which heats the wafer W in the above examples, the cooling part and the heating part do not have to be coupled but may be separate bodies.

Further, though the cooling part is provided in the treatment block BL1 in the form of being included in the thermal treatment apparatus 40 in the above examples, the cooling part may be provided not in the treatment block BL1 but in the block or station adjacent to the treatment block BL1, specifically, for example, in the delivery block BL2 or the interface station 12. In other words, the cooling treatment for suppressing the deprotection reaction in the metal-containing resist film may be performed using the cooling module 54 in the delivery tower 52 in the delivery block BL2.

Figure 11:
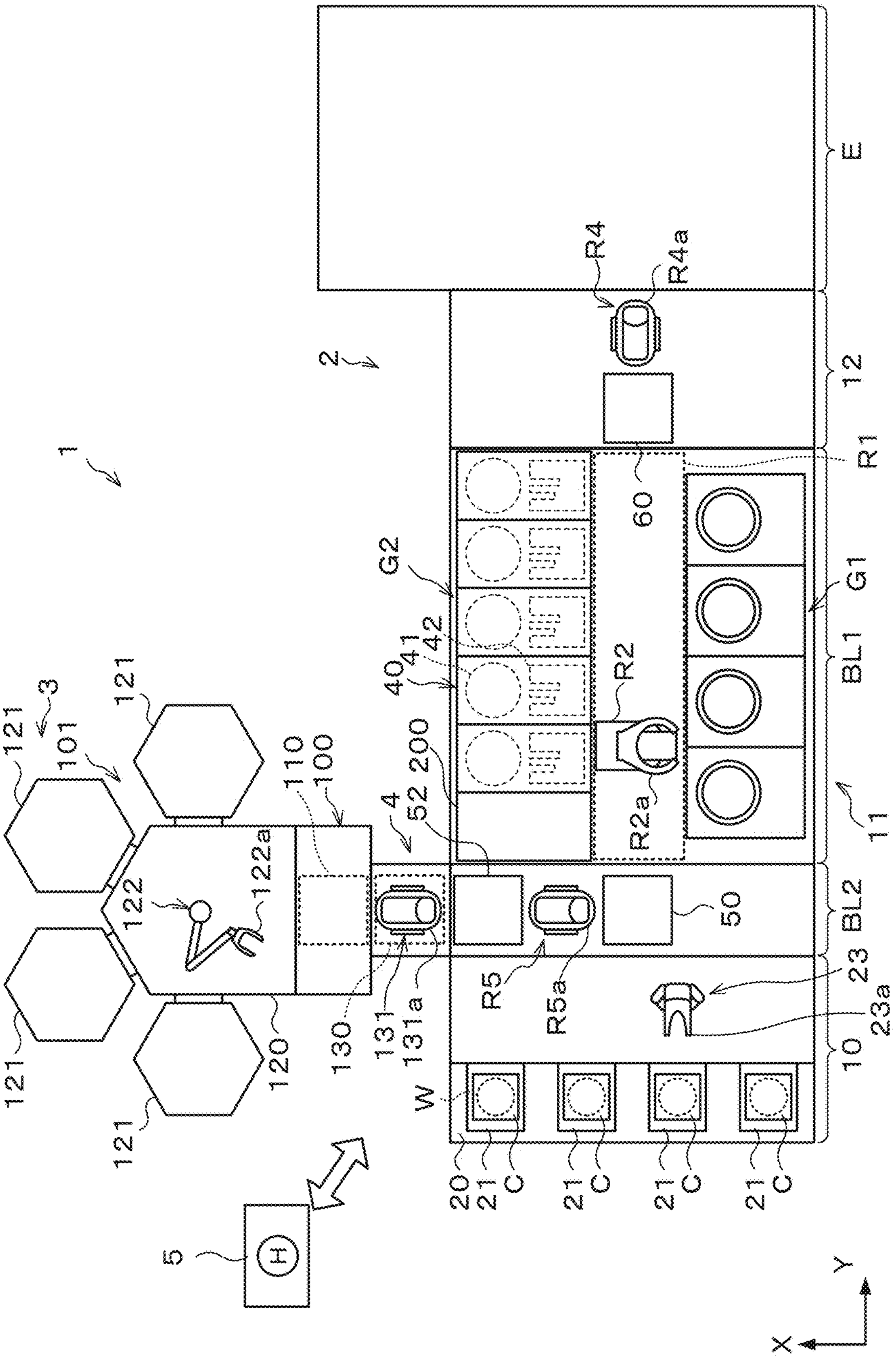
FIG. 11 is a view for explaining another example of an energy applier.

FIG. 11 is a view for explaining another example of the energy applier.

In the above examples, the thermal treatment module 40 functions as the energy applier to apply heat as energy to the metal-containing resist film on the wafer W. In contrast, in the example in FIG. 11, a UV irradiation module 200 is provided as the energy applier in the treatment block BL1. The UV irradiation module 200 radiates an ultraviolet ray to apply energy to the metal-containing resist film on the wafer W. In other words, in the case where the UV irradiation module 200 is provided as the energy applier, the metal-containing resist film is irradiated with the ultraviolet ray in the energy applying treatment.

Specifically, in the case where the UV irradiation module 200 is provided as the energy applier, the metal-containing resist film on the wafer W is irradiated with the ultraviolet ray in the energy applying treatment at Step S7 in Examples 1, 2 of the wafer treatment, at Step S25 in Example 3 of the wafer treatment, at Step S32 in Example 4 of the wafer treatment, and at Step S42 in Example 4 of the wafer treatment.

Note that both the thermal treatment module 40 and the UV irradiation module 200 may be provided as the energy applier in the wafer treatment apparatus 1. In this case, one or both of the heat treatment by the thermal treatment module 40 and the ultraviolet irradiation treatment by the UV irradiation module 200 may be performed in the wafer treatment on one wafer W as the energy applying treatment.

Besides, in the wafer treatment apparatus 1, the wafer W may be transferred so that the time between the cooling treatment and the energy applying treatment is equal among the wafers W, specifically, the controller 5 may perform control to make them equal as above.

Second Embodiment

Figure 12:
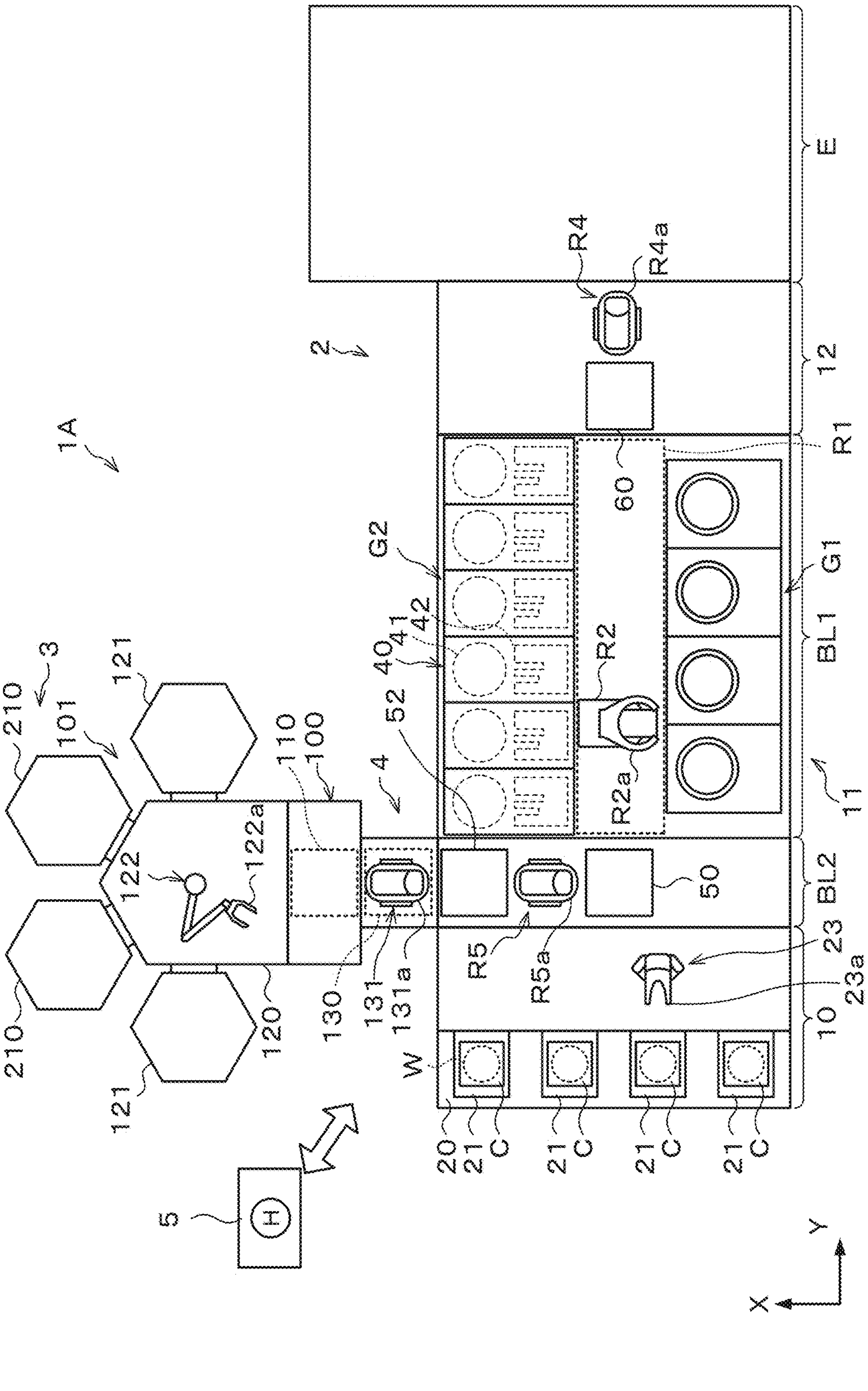
FIG. 12 is an explanatory view illustrating the outline of an internal configuration of a wafer treatment apparatus as a substrate treatment apparatus according to a second embodiment.

FIG. 12 is an explanatory view illustrating the outline of an internal configuration of a wafer treatment apparatus as a substrate treatment apparatus according to a second embodiment.

In the wafer treatment apparatus 1 in FIG. 1, the thermal treatment module 40 as the energy applier is provided only in the wet treatment part 2. In contrast, in a wafer treatment apparatus 1A in FIG. 12, not only the thermal treatment module 40 as the energy applier is provided in the wet treatment part 2 but also a thermal treatment module 210 as the energy applier is provided in a dry treatment part 3.

The thermal treatment module 210 is provided, for example, outside of the vacuum transfer chamber 120 in the dry treatment part 3. The number and arrangement of the thermal treatment modules 210 can be arbitrarily selected.

Further, in the dry treatment part 3, the transfer module 122 in the vacuum transfer chamber 120 can transfer the wafer W between the plurality of treatment modules, the thermal treatment module, and the load lock module 110 while holding the wafer W by the transfer arm 122*a*.

In the wafer treatment using the wafer treatment apparatus 1A, either the dry developing treatment or the wet developing treatment is performed subsequent to the energy applying treatment. Further, in the wafer treatment using the wafer treatment apparatus 1A, in the case of performing the dry developing treatment, the energy applying treatment, namely, the treatment of improving the selectivity is performed using the dry treatment part 3 coping with only the dry development, specifically, using the thermal treatment module 210 provided in the dry treatment part 3. On the other hand, in the case of performing the wet developing treatment, the energy applying treatment is performed using the wet treatment part 2 coping with only the wet development, specifically, using the thermal treatment module 40 provided in the wet treatment part 2

This can shorten the time after the finish of the energy applying treatment to the start of the dry developing treatment and the time after the finish of the energy applying treatment to the start of the wet developing treatment. As a result, it is possible to prevent the metal-containing resist film on the wafer W from being affected by the ambient atmosphere in a period after the finish of the energy applying treatment to the start of the dry developing treatment or a period after the finish of the energy applying treatment to the start of the wet developing treatment.

Third Embodiment

Figure 13:
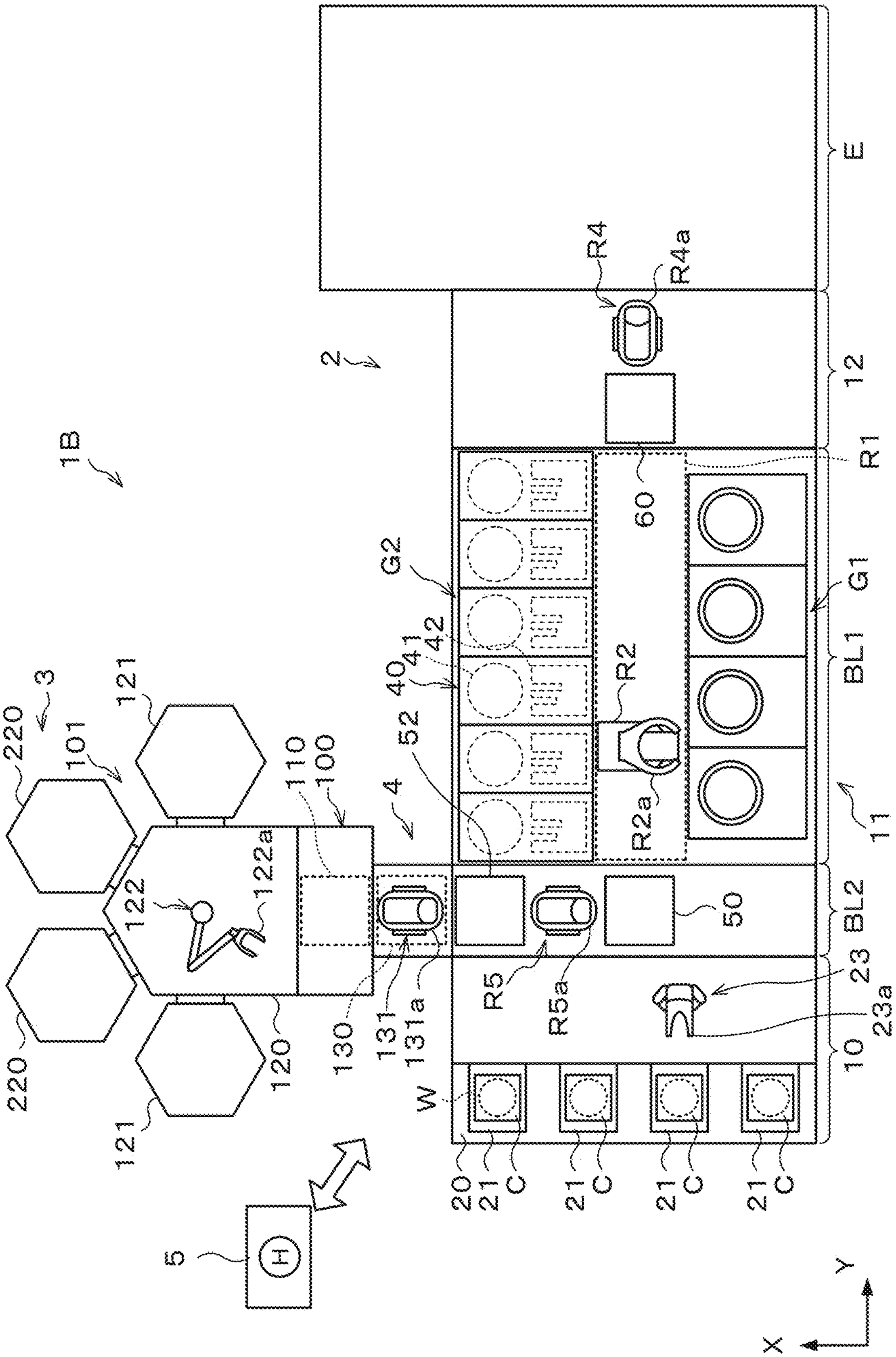
FIG. 13 is an explanatory view illustrating the outline of an internal configuration of a wafer treatment apparatus as a substrate treatment apparatus according to a third embodiment.

FIG. 13 is an explanatory view illustrating the outline of an internal configuration of a wafer treatment apparatus as a substrate treatment apparatus according to a third embodiment.

A wafer treatment apparatus 1B in FIG. 13 has a spray module 220 in addition the components in the wafer treatment apparatus 1 in FIG. 1.

In the wafer treatment using the wafer treatment apparatus 1B in FIG. 13, after the dry developing treatment performed subsequent to the energy applying treatment, clustered gas particles can be sprayed to the wafer W using the spray module 220.

Figure 14:
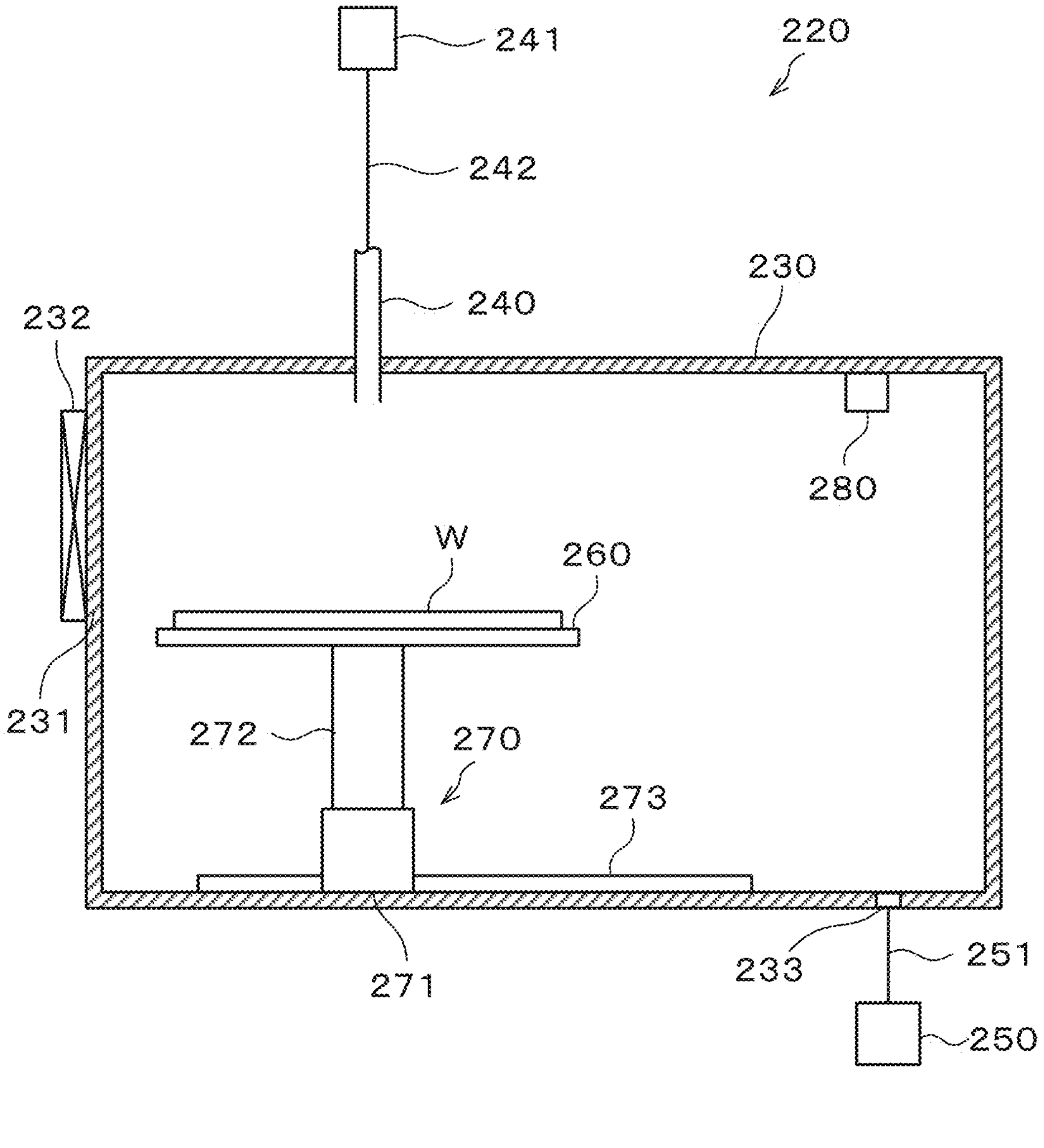
FIG. 14 is a cross-sectional view illustrating the outline of a configuration of a spray module.

FIG. 14 is a cross-sectional view illustrating the outline of a configuration of the spray module 220.

The spray module 220 has a treatment container 230 configured such that its inside can be reduced in pressure as illustrated in FIG. 14. A transfer-in/out port 231 is formed at the surface of the treatment container 230 on the vacuum transfer chamber 120 side, and a gate valve 232 is provided at the transfer-in/out port 231. The treatment container 230 is connected to the vacuum transfer chamber 120 via the gate valve 232.

To a ceiling wall of the treatment container 230, a nozzle 240 is connected as a gas supplier which supplies a predetermined gas such as a mixed as of hydrogen and carbon dioxide to the inside of the treatment container 230. To the nozzle 240, a gas supply mechanism 241 which supplies the predetermined gas to the nozzle 240 is connected via a gas supply pipe 242. The gas supply mechanism 241 has, for example, supply sources of various gases and a gas flow rate regulator, and is controlled by the controller 5.

A bottom wall of the treatment container 230 is formed with an exhaust port 233 for reducing the pressure in the treatment container 230. To the exhaust port 233, an exhaust mechanism 250 which exhausts the inside of the treatment container 230 is connected via an exhaust pipe 251. The exhaust mechanism 250 has, for example, an exhaust pump.

Inside the treatment container 230, a support plate 260 is provided as a mounting part on which the wafer W is mounted. The support plate 260 has, for example, an electrostatic chuck for holding the wafer W mounted thereon and so on.

To the support plate 260, a rotating and moving mechanism 270 is connected which rotates and horizontally moves the support plate 260. The rotating and moving mechanism 270 has, for example, a drive 271 including a motor which drives the rotation of the support plate 260 and so on. The drive 271 is connected to the support plate 260 via a leg member 272. The rotating and moving mechanism 270 further has a rail 273 extending in the horizontal direction (right-left direction in the drawing), and the drive 271 is configured to be movable along the rail 273. The drive 271 also has a drive source such as a motor which drives the movement along the rail 273.

Further, in the treatment container 230, a pressure sensor 280 is provided which measures the pressure inside the treatment container 230.

Further, a plurality of lifters (not illustrated) which rise and lower with respect to the support plate 260 are provided in the treatment container 230. The lifters are used when delivering the wafer W between the transfer module 122 in the vacuum transfer chamber 120 and the support plate 260.

In the spray module 220, the supplied gas introduced from the gas supply mechanism 241 into the nozzle 240 is sprayed from the nozzle 240 toward the wafer W mounted on the support plate 260 and supplied into the treatment container 230. The gas supplied via the nozzle 240 into the treatment container 230 adiabatically expands in the treatment container 230, and is then cooled and condensed into clusters of gas particles, which collide with the wafer W mounted on the support plate 260.

By spraying the clustered gas particles to the wafer W using the spray module 220 after the dry developing treatment performed subsequent to the energy applying treatment, it is possible to remove the particles on the wafer W after the dry developing treatment. Specifically, it is possible to remove fine (for example, 5 to 30 nm) particles in recesses of the pattern of the metal-containing resist film formed by the dry developing treatment. Because there are may processes for an inter-pattern dimension of less than 30 nm in the patterning using the exposure with EUV light, the method of removing particles using the gas particles as in this example, namely, the cleaning using gas is useful as a method of removing residues between the patterns after the development.

Note that the UV irradiation module may be provided as the energy applier, instead of or in addition to the thermal treatment module 40 also in the second embodiment and the third embodiment.

EXAMPLES

The present inventors carried out tests for the influence of the wafer treatment using the wafer treatment apparatus 1 according to the first embodiment on the selectivity during the development of the metal-containing resist film. Note that the developing treatment in the tests is also by the negative development.

In Examples 1 to 3, the metal-containing resist film forming treatment, the PAB treatment, the exposure treatment, the PEB treatment, the cooling treatment, the heat treatment as the energy applying treatment, and the dry developing treatment were performed in sequence on the wafer W as in above Example 1 of the wafer treatment.

On the other hand, in Comparative Example 1, the cooling treatment and the heat treatment as the energy applying treatment were not performed on the wafer W, but only the metal-containing resist film forming treatment, the PAB treatment, the exposure treatment, the PEB treatment, and the dry developing treatment were performed in sequence.

In Comparative Example 2, the heat treatment as the energy applying treatment was not performed on the wafer W, but only the metal-containing resist film forming treatment, the PAB treatment, the exposure treatment, the PEB treatment, the cooling treatment, and the dry developing treatment were performed in sequence.

Further, a HBr gas was used as the developing gas, namely, the treatment gas and the temperature of the wafer W was set to 10° C. in the dry developing treatment of Comparative Example 1 and Examples 1, 2, and a $BCl_3$ gas was used as the developing gas in the dry developing treatment and the temperature of the wafer W was set to 100° C. in the dry developing treatment of Comparative Example 2 and Example 3.

Further, the wafer W was cooled down to room temperature (23° C.) in the cooling treatment in each of Examples 1 to 3 and Comparative Example 2.

Furthermore, the wafer W was heated at 200° C. for 60 seconds in a $N_2$ atmosphere in the heat treatment as the energy applying treatment in Example 1, and the wafer W was heated at 200° C. for 90 seconds in a $N_2$ atmosphere in the heat treatment as the energy applying treatment in Examples 2, 3.

Treatment conditions (for example, the pressure, the treatment time, and so on during the dry developing treatment) other than the above are common to Examples 1 to 3 and Comparative Examples 1, 2.

Figure 15:
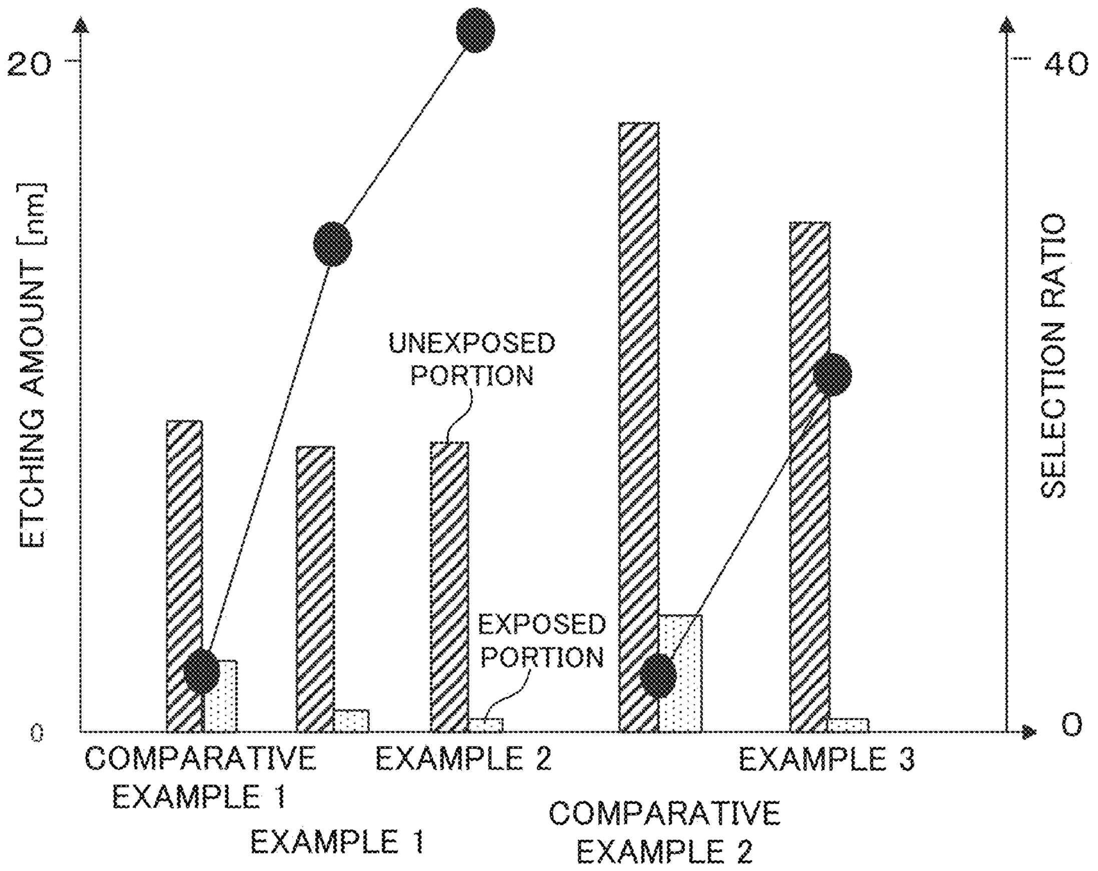
FIG. 15 is a chart illustrating results of tests regarding the selectivity during the development of a metal-containing resist film carried out by the present inventors.

As explained above, the HBr gas was used as the developing gas and the temperature of the wafer W was set to 10° C. in the dry developing treatment of each of Comparative Example 1 and Examples 1, 2, and the selectivity during the development of the metal-containing resist film, namely, the selection ratio was about 7 times and about 10 times that of Comparative Example 1 in Example 1 and in Example 2, respectively as illustrated in FIG. 15.

Further, as explained above, the $BCL_3$ gas was used as the developing gas and the temperature of the wafer W was set to 100° C. in the dry developing treatment of each of Comparative Example 2 and Example 3, and the selection ratio during the development of the metal-containing resist film in Example 3 was about 5 times that of Comparative Example 2.

It can be said from the above that the technique according to this disclosure can improve the selectivity during the development of the metal-containing resist film and, as a result, can obtain an excellent pattern (specifically, a pattern with desired dimensions).

Note that though not illustrated, all of the patterns of the metal-containing resist obtained in Examples 1 to 3 were excellent in surface roughness.

Further, though not illustrated, also in the case where the heat treatment as the energy applying treatment was performed in an atmospheric gas atmosphere unlike Examples 1 to 3, the same results as in Examples 1 to 3 were obtained.

The embodiments disclosed herein are examples in all respects and should not be considered to be restrictive. Various omissions, substitutions and changes may be made in the embodiment without departing from the scope and spirit of the attached claims. For example, configuration requirements of the above embodiments can be arbitrarily combined. The operations and effects about the configuration requirements relating to the combination can be obtained as a matter of course from the arbitrary combination, and those skilled in the art can obtain clear other operations and effects from the description herein.

The effects described herein are merely explanatory or illustrative in all respects and not restrictive. The technique relating to this disclosure can offer clear other effects to those skilled in the art from the description herein in addition to or in place of the above effects.

Note that the following configuration examples also belong to the technical scope of this disclosure.

(1) A substrate treatment method for performing a treatment for forming a pattern through precursor formation and a condensation reaction of a metal-containing resist, the substrate treatment method including: suppressing the precursor formation of a film of the metal-containing resist formed on a substrate on which exposure and a PEB treatment have been performed; and subsequent thereto, improving selectivity of the film by the condensation reaction in the film before the forming the pattern.

(2) A substrate treatment method for performing a treatment for forming a pattern through precursor formation and a condensation reaction of a metal-containing resist, the substrate treatment method including: suppressing the precursor formation of the metal-containing resist by cooling a substrate on which a film of the metal-containing resist has been formed and exposure and a PEB treatment have been performed; and after the suppressing the precursor formation and before the forming the pattern, improving selectivity of the film during development by the condensation reaction in the film by applying energy to the film.

(3) The substrate treatment method according to the (2), wherein the suppressing the precursor formation and the improving the selectivity are successively performed without another treatment intervening therebetween.

(4) The substrate treatment method according to the (2) or (3), wherein the applying energy to the film in the improving the selectivity is at least one of heating the substrate and irradiating the film with an ultraviolet ray.

(5) The substrate treatment method according to any one of the (1) to (4), wherein:

the pattern is formed by performing development at least twice on the substrate on which the film has been formed and the exposure has been performed; and the suppressing the precursor formation and the improving the selectivity are performed only either before development for a first time or before development for a second time.

(6) The substrate treatment method according to the (5), further including:

performing the PEB treatment for a first time on the substrate on which the film has been formed and the exposure has been performed;

then performing the development for the first time on the substrate;

then performing the PEB treatment for a second time on the substrate; and performing the development for the second time, after the performing the suppressing the precursor formation and the improving the selectivity subsequent to the performing the PEB treatment for the second time.

(7) The substrate treatment method according to the (6), further including:

performing the PEB treatment for a first time on the substrate on which the film has been formed and the exposure has been performed;

then performing the development for the first time on the substrate;

then performing a thermal treatment, as the suppressing the precursor formation and the improving the selectivity; and then performing the development for the second time.

(8) The substrate treatment method according to any one of the (1) to (4), further including after the improving the selectivity, performing development in a dry mode or a wet mode, wherein:

in a case of performing the development in the dry mode in the performing the development, the improving the selectivity is performed using a treatment part coping with only the development in the dry mode; and in a case of performing the development in the wet mode in the performing the development, the improving the selectivity is performed using a treatment part coping with only the development in the wet mode.

(9) The substrate treatment method according to any one of the (1) to (8), further including:

after the improving the selectivity, performing development in a dry mode; and thereafter, spaying clustered gas particles to the substrate.

(10) The substrate treatment method according to any one of the (1) to (9), wherein the substrate is transferred so that a time between the suppressing the precursor formation and the improving the selectivity is constant for each substrate.

(11) A program running on a computer of a controller for controlling a substrate treatment apparatus so as to cause the substrate treatment apparatus to execute a substrate treatment method for performing a treatment for forming a pattern through precursor formation and a condensation reaction of a metal-containing resist, the method including:

suppressing the precursor formation of the metal-containing resist by cooling a substrate on which a film of the metal-containing resist has been formed and exposure and a PEB treatment have been performed; and after the suppressing the precursor formation and before the forming the pattern, improving selectivity of the film during development by the condensation reaction in the film by applying energy to the film.

(12) A substrate treatment apparatus including:

a resist coater configured to form a film of a metal-containing resist on a substrate;

a cooling part configured to cool the substrate;

an energy applier configured to apply energy to the film; and a controller, wherein the controller is configured to execute:

suppressing precursor formation of the metal-containing resist by cooling the substrate on which the film of the metal-containing resist has been formed and exposure and a PEB treatment have been performed; and after the suppressing the precursor formation and before forming a pattern of the metal-containing resist, improving selectivity of the film during development by a condensation reaction in the film by applying energy to the film.

According to this disclosure, it is possible to form an excellent pattern of a metal-containing resist.

What is claimed is:

1. A substrate treatment method for performing a treatment for forming a pattern through precursor formation and a condensation reaction of a metal-containing resist, the substrate treatment method comprising:

suppressing the precursor formation of a film of the metal-containing resist formed on a substrate as a result of an exposure treatment and a PEB treatment performed on the substrate; and subsequent thereto, improving selectivity of the film by the condensation reaction in the film before the forming the pattern.

2. A substrate treatment method for performing a treatment for forming a pattern through precursor formation and a condensation reaction of a metal-containing resist, the substrate treatment method comprising:

suppressing the precursor formation of the metal-containing resist by cooling a substrate on which a film of the metal-containing resist has been formed and exposure and a PEB treatment have been performed; and after the suppressing the precursor formation and before the forming the pattern, improving selectivity of the film during development by the condensation reaction in the film by applying energy to the film.

3. The substrate treatment method according to claim 2, wherein the suppressing the precursor formation and the improving the selectivity are successively performed without another treatment intervening therebetween.

4. The substrate treatment method according to claim 2, wherein the applying energy to the film in the improving the selectivity is at least one of heating the substrate and irradiating the film with an ultraviolet ray.

5. The substrate treatment method according to claim 2, wherein:

the pattern is formed by performing development at least twice on the substrate on which the film has been formed and the exposure has been performed; and the suppressing the precursor formation and the improving the selectivity are performed only either before development for a first time or before development for a second time.

6. The substrate treatment method according to claim 5, further comprising:

performing the PEB treatment for a first time on the substrate on which the film has been formed and the exposure has been performed;

then performing the development for the first time on the substrate;

then performing the PEB treatment for a second time on the substrate; and performing the development for the second time, after the performing the suppressing the precursor formation and the improving the selectivity subsequent to the performing the PEB treatment for the second time.

7. The substrate treatment method according to claim 6, further comprising:

performing the PEB treatment for a first time on the substrate on which the film has been formed and the exposure has been performed;

then performing the development for the first time on the substrate;

then performing a thermal treatment, as the suppressing the precursor formation and the improving the selectivity; and then performing the development for the second time.

8. The substrate treatment method according to claim 2, further comprising after the improving the selectivity, performing development in a dry mode or a wet mode, wherein:

in a case of performing the development in the dry mode in the performing the development, the improving the selectivity is performed using a treatment part coping with only the development in the dry mode; and in a case of performing the development in the wet mode in the performing the development, the improving the selectivity is performed using a treatment part coping with only the development in the wet mode.

9. The substrate treatment method according to claim 2, further comprising:

after the improving the selectivity, performing development in a dry mode; and thereafter, spraying clustered gas particles to the substrate.

10. The substrate treatment method according to claim 2, wherein the substrate is transferred so that a time between the suppressing the precursor formation and the improving the selectivity is constant for each substrate.

11. A computer-readable storage medium storing a program running on a computer of a controller for controlling a substrate treatment apparatus so as to cause the substrate treatment apparatus to execute a substrate treatment method for performing a treatment for forming a pattern through precursor formation and a condensation reaction of a metal-containing resist, the substrate treatment method comprising:

suppressing the precursor formation of the metal-containing resist by cooling a substrate on which a film of the metal-containing resist has been formed and exposure and a PEB treatment have been performed; and after the suppressing the precursor formation and before the forming the pattern, improving selectivity of the film during development by the condensation reaction in the film by applying energy to the film.

* * * * *